United States Patent
Lee et al.

(10) Patent No.: US 9,696,600 B2
(45) Date of Patent: Jul. 4, 2017

(54) LIQUID CRYSTAL DISPLAY DEVICE AND MANUFACTURING METHOD THEREOF

(71) Applicant: Samsung Display Co., Ltd., Yongin-Si, Gyeonggi-Do (KR)

(72) Inventors: Dae Ho Lee, Seoul (KR); Won Tae Kim, Suwon-si (KR); Sung Hwan Won, Suwon-si (KR); You Young Jin, Suwon-si (KR); Kyung Tae Chae, Hwaseong-si (KR); Pil Sook Kwon, Incheon (KR); Yong Seok Kim, Seoul (KR); Han Joon Yoo, Seoul (KR); Seon Uk Lee, Seongnam-si (KR); Woo Jae Lee, Yongin-si (KR); Tae Woo Lim, Hwaseong-si (KR)

(73) Assignee: SAMSUNG DISPLAY CO., LTD. (KR)

( * ) Notice: Subject to any disclaimer, the term of this patent is extended or adjusted under 35 U.S.C. 154(b) by 0 days.

(21) Appl. No.: 15/134,855

(22) Filed: Apr. 21, 2016

(65) Prior Publication Data
US 2016/0231611 A1  Aug. 11, 2016

Related U.S. Application Data

(62) Division of application No. 14/201,337, filed on Mar. 7, 2014, now Pat. No. 9,323,090.

(30) Foreign Application Priority Data

Aug. 22, 2013 (KR) .......... 10-2013-0099932

(51) Int. Cl.
  *G02F 1/136* (2006.01)
  *G02F 1/1343* (2006.01)
  (Continued)

(52) U.S. Cl.
  CPC ........ *G02F 1/13439* (2013.01); *G02F 1/1341* (2013.01); *G02F 1/1368* (2013.01);
  (Continued)

(58) Field of Classification Search
  CPC ......... G02F 1/136227; G02F 1/136286; G02F 1/1368; G02F 1/1341; G02F 1/13439;
  (Continued)

(56) References Cited

U.S. PATENT DOCUMENTS 6,952,303 B2   10/2005   Lin et al.
7,522,332 B2 *  4/2009   Liang ................. C08G 18/5015
                                                                    359/296

(Continued)

FOREIGN PATENT DOCUMENTS

KR    10-1998-0030144    7/1998
KR       10-0209424      7/1999
(Continued)

*Primary Examiner* — James Dudek
(74) *Attorney, Agent, or Firm* — Innovation Counsel LLP

(57) ABSTRACT

A display device may include a substrate and a first roof layer portion that is formed of a roof layer material and overlaps the substrate in a direction, the direction is perpendicular to a surface of the substrate. A lateral surface of the first roof layer portion is disposed in a plane. The display device may further a second roof layer portion formed of the roof layer material and separated from the first roof layer portion. The display device may further a common electrode portion disposed between the first roof layer portion and the substrate in the direction. A lateral surface of the common electrode portion is disposed in the plane or is spaced from the lateral surface of the first roof layer portion in a second direction parallel to the surface of the substrate. The display device may further a pixel electrode disposed between the first common electrode portion and the substrate.

20 Claims, 22 Drawing Sheets

(51) Int. Cl.
*G02F 1/1333* (2006.01)
*H01L 29/786* (2006.01)
*G02F 1/1341* (2006.01)
*G02F 1/1362* (2006.01)
*G02F 1/1368* (2006.01)
*H01L 27/12* (2006.01)

(52) U.S. Cl.
CPC .. *G02F 1/133345* (2013.01); *G02F 1/133377* (2013.01); *G02F 1/136227* (2013.01); *G02F 1/136286* (2013.01); *H01L 27/124* (2013.01); *H01L 27/1288* (2013.01); *H01L 29/78633* (2013.01); *G02F 2001/134318* (2013.01); *G02F 2001/136295* (2013.01)

(58) Field of Classification Search
CPC ........... G02F 1/133377; G02F 1/13345; H01L 27/124; H01L 27/1288; H01L 29/78633
See application file for complete search history.

(56) References Cited

U.S. PATENT DOCUMENTS

| | | | |
|---|---|---|---|
| 7,875,485 | B2 | 1/2011 | Sasagawa et al. |
| 2012/0062448 | A1 | 3/2012 | Kim et al. |
| 2013/0321734 | A1 | 12/2013 | Won et al. |
| 2014/0152948 | A1 | 6/2014 | Chae et al. |
| 2014/0176893 | A1 | 6/2014 | Sugitani et al. |
| 2014/0267966 | A1 | 9/2014 | Won et al. |
| 2014/0354912 | A1 | 12/2014 | Lee et al. |
| 2014/0375931 | A1 | 12/2014 | Kim et al. |
| 2014/0375937 | A1 | 12/2014 | Lee et al. |
| 2015/0049282 | A1 | 2/2015 | Kim et al. |
| 2015/0092130 | A1 | 4/2015 | Lee et al. |
| 2015/0092143 | A1 | 4/2015 | Cha et al. |

FOREIGN PATENT DOCUMENTS

| | | |
|---|---|---|
| KR | 10-0237343 | 10/1999 |
| KR | 10-1999-0085598 | 12/1999 |
| KR | 10-0265943 | 6/2000 |

* cited by examiner

LIQUID CRYSTAL DISPLAY DEVICE AND MANUFACTURING METHOD THEREOF

CROSS-REFERENCE TO RELATED APPLICATION

This application is a divisional application of U.S. patent application Ser. No. 14/201,337 filed on Mar. 7, 2014, which claims priority to and the benefit of Korean Patent Application No. 10-2013-0099932 filed in the Korean Intellectual Property Office on Aug. 22, 2013, the entire contents of which are incorporated herein by reference.

BACKGROUND (a) Field

The present invention relates to a liquid crystal display device and a manufacturing method thereof.

(b) Description of the Related Art

A liquid crystal display device (or liquid crystal display) may include a pixel electrode, a common electrode, and a liquid crystal layer disposed between the pixel electrode and the common electrode. Voltages may be applied to the pixel electrode and the common electrode to control the arrangement of the liquid crystal molecules in the liquid crystal layer. Therefore, images displayed by the liquid crystal display may be controlled..

A method for manufacturing a liquid crystal display may include forming a sacrificial layer, removing the sacrificial layer to form a cavity, and filling the cavity with liquid crystal material.

The method may include a process of patterning a common electrode material layer and an insulating material layer to expose the sacrificial layer. In this patterning process or as a result of this patterning process, because of a process margin and/or misalignment, a portion of the common electrode material layer may protrude and/or sag and may undesirably contact a pixel electrode and/or another conductive element to cause unwanted short circuit. As a result, the quality of the liquid crystal display may be unacceptable.

The above information disclosed in this Background section is for enhancement of understanding of the background of the invention. This Background section may contain information that does not form the prior art that is already known in this country to a person of ordinary skill in the art.

SUMMARY

Embodiments of the present invention may be related to display device, e.g., a liquid crystal display device, in which unwanted short circuit that potentially involves a common electrode may be prevented. Embodiment of the present invention may be related to a method for manufacturing the display device.

An embodiment of the present invention may be related to a display device that may include a substrate. The display device may further include a first roof layer portion that is formed of a roof layer material and overlaps the substrate in a first direction, the first direction being perpendicular to a surface (e.g., bottom surface or top surface) of the substrate. A lateral surface of the first roof layer portion may be disposed in a first plane, which is an imaginary geometric plane in space. The display device may further a second roof layer portion that is formed of the roof layer material and is separated from the first roof layer portion in a second direction substantially perpendicular to the first direction. A lateral surface of the second roof layer portion may immediately neighbor and be disposed opposite the lateral surface of the first roof layer portion. The display device may further a first common electrode portion disposed between the first roof layer portion and the substrate in the first direction. A lateral surface of the first common electrode portion may be disposed in the first plane or may be spaced from the lateral surface of the first roof layer portion in a second direction parallel to the surface of the substrate. The display device may further a pixel electrode disposed between the first common electrode portion and the substrate.

The display device may include a first insulating layer portion disposed between the first roof layer portion and the first common electrode portion in the first direction. A lateral surface of the first insulating layer portion may be disposed in the first plane or may be disposed between the first roof layer portion and the substrate in the first direction.

Each of the lateral surface of the first common electrode portion and the lateral surface of the first insulating layer portion may be disposed in the first plane.

The display device may include a second insulating layer portion. The first roof layer portion may be disposed between the second insulating layer portion and the first insulating layer portion in the first direction. A lateral surface of the second insulating layer portion may be disposed in the first plane.

The display device may include a second insulating layer portion. The first roof layer portion may be disposed between the first insulating layer portion and a first portion of the second insulating layer portion in the first direction. A second portion of the second insulating layer portion may directly contact the lateral surface of the first roof layer portion and may meet (and/or directly contact) the first insulating layer portion at a corner of the first roof layer portion.

The lateral surface of the first insulating layer portion may be disposed between the lateral surface of the first roof layer portion and the substrate in the first direction.

A first contact surface of the first insulating layer portion may directly contact the first roof layer portion. A second contact surface of the first insulating layer portion may directly contact the first common electrode portion and may be smaller than the first contact surface of the first insulating layer portion.

The display device may include an insulating layer. The first roof layer portion may be disposed between the first common electrode portion and a first portion of the insulating layer in the first direction. A second portion of the insulating layer may directly contact the lateral surface of the first roof layer portion.

The lateral surface of the first common electrode portion may be disposed between the first roof layer portion and the substrate in the first direction.

The display device may include a capping layer. At least one of a corner portion of the first roof layer portion and the lateral surface of the first roof layer portion may be disposed between two portions of the capping layer in the first direction.

The lateral surface of the second roof layer portion may be disposed in a second plane. The second roof layer portion may overlap a second common electrode portion in the first direction. The second common electrode portion and the first common electrode portion may be made of a same material and are separated from each other. A minimum distance between the lateral surface of the first common electrode portion and a lateral surface of the second common electrode portion may be greater than or equal to a minimum distance between the first plane and the second plane.

The second plane may be disposed at an acute angle with respect to the first plane.

The minimum distance between the lateral surface of the first common electrode portion and the lateral surface of the second common electrode portion may be greater than the minimum distance between the first plane and the second plane.

An embodiment of the present invention may be related to a method for manufacturing a display device. The method may include the following steps: forming a first pixel electrode and a second pixel electrode that overlap a substrate in a first direction, the first direction being perpendicular to a surface of the substrate; forming a common electrode material layer that overlaps the first pixel electrode and the second pixel electrode; forming a roof layer material layer that overlaps the common electrode material layer; removing a portion of the roof layer material layer to form a first roof layer portion and a second roof layer portion, the first roof layer portion overlapping the first pixel electrode, the second roof layer portion overlapping the second pixel electrode, a lateral surface of the first roof layer portion being disposed in a first plane; and removing a portion of the common electrode material layer to form a first common electrode portion and a second common electrode portion, the first common electrode portion being disposed between the first roof layer portion and the first pixel electrode, the second common electrode portion being disposed between the second roof layer portion and the second pixel electrode, a lateral surface of the first common electrode portion being disposed in the first plane or being spaced from the lateral surface of the first roof layer portion in a second direction parallel to the surface of the substrate.

The method may include the following steps: disposing a first mask portion that overlaps the first roof layer portion, wherein an edge of the first mask portion is aligned with an edge of the first roof layer portion in the first direction; disposing a second mask portion that overlaps the second roof layer portion, wherein an edge of the second mask portion is aligned with an edge of the second roof layer portion in the first direction; and using the first mask portion and the second mask portion to partially protect the common electrode material layer when removing the portion of the common electrode material layer.

The method may include the following steps: forming an insulating material layer on the first roof layer portion and the second roof layer portion such that the insulating material layer directly contacts the lateral surface of the first roof layer portion; and using the first mask portion and the second mask portion to partially protect the insulating material layer when removing a portion of the insulating material layer disposed between the first roof layer portion and the second roof layer portion to form a first insulating layer part and a second insulating layer part.

A lateral surface of the first insulating layer part may be disposed in the first plane.

The method may include the following steps: forming an insulating material layer that directly contacts the common electrode material layer; removing a portion of the insulating material layer to form a first insulating layer portion and a second insulating layer portion, the first insulating layer portion being disposed between the first roof layer portion and the first common electrode portion, a lateral surface of the first insulating layer portion being disposed in the first plane or being disposed between the lateral surface of the first roof layer portion and the substrate in the first direction.

The method may include the following steps: forming a first sacrificial roof layer portion between the first roof layer portion and the second roof layer portion; and using the first roof layer portion, the second roof layer portion, and the first sacrificial roof layer portion to partially protect the common electrode material layer when removing the portion of the common electrode material layer, such that a sacrificial common electrode portion is formed between the first common electrode portion and the second common electrode portion.

The method may include the following steps: forming a first insulating material layer that directly contacts the common electrode material layer; using the first roof layer portion, the second roof layer portion, and the first sacrificial roof layer portion to partially protect the first insulating material layer when removing a portion of the first insulating material layer to form a first insulating layer portion, a second insulating layer portion, and a sacrificial insulating layer portion disposed between the first insulating layer portion and the second insulating layer portion, the first insulating layer portion being disposed between the first roof layer portion and the first common electrode portion, a lateral surface of the first insulating layer portion being disposed between the lateral surface of the first roof layer portion and the substrate in the first direction.

The method may include the following steps: before the step of forming the common electrode material layer, forming a sacrificial layer that overlaps the substrate; disposing a second insulating material layer on the first roof layer portion, a portion of the sacrificial layer, and the first sacrificial roof layer portion such that a first insulating layer part is formed on the first roof layer portion, that a first sacrificial insulating layer part is formed between the first common electrode portion and the sacrificial common electrode portion, that a second sacrificial insulating layer part is formed on the first sacrificial roof layer portion, that a first hole is formed between the first insulating layer portion and the first sacrificial insulating layer part, and that a second hole is formed between the sacrificial insulating layer portion and the first sacrificial insulating layer part; providing one or more chemicals through the first hole and the second hole for removing the sacrificial layer to form a cavity; and providing a liquid crystal material in the cavity.

The first insulating layer part may meet and/or directly contact the first insulating layer portion at a corner of the first roof layer portion.

The first insulating layer part may directly contact and cover the lateral portion of the first roof layer portion.

The method may include the following steps: before the step of forming the common electrode material layer, forming a sacrificial layer that overlaps the substrate; disposing an insulating material layer on the first roof layer portion, a portion of the sacrificial layer, and the first sacrificial roof layer portion such that a first insulating layer part is formed on the first roof layer portion, that a first sacrificial insulating layer part is formed between the first common electrode portion and the sacrificial common electrode portion, that a second sacrificial insulating layer part is formed on the first sacrificial roof layer portion, that a first hole is formed between the first common electrode portion and the first sacrificial insulating layer part, and that a second hole is formed between the sacrificial common electrode portion and the first sacrificial insulating layer part; providing one or more chemicals through the first hole and the second hole for removing the sacrificial layer to form a cavity; and providing a liquid crystal material in the cavity.

The method may include the following step: before the step of disposing the insulating material layer, performing ashing on the sacrificial layer.

At least one of the first sacrificial insulating layer part, the second sacrificial insulating layer part, the first sacrificial roof portion, and the sacrificial common electrode portion may be removed when the sacrificial layer is removed.

The method may include the following steps: forming a gate line; and forming a transistor that overlaps the substrate and includes a gate electrode, wherein the gate electrode is electrically connected to the gate line, and wherein the first hole extends parallel to the gate line.

The method may include the following step: forming a second sacrificial roof layer portion between the first roof layer portion and the second roof layer portion, wherein a gap may separate the second sacrificial roof layer portion from the first sacrificial roof layer portion and may connect the second hole to the first hole.

The method may include the following steps: before the step of forming the common electrode material layer, forming a sacrificial layer that overlaps the substrate; using the first roof layer portion, the second roof layer portion, and the first sacrificial roof layer portion to partially protect the sacrificial layer when removing a portion of the sacrificial layer; removing the sacrificial layer to form a cavity; and providing a liquid crystal material in the cavity.

The first sacrificial roof layer portion may have a saw tooth shape in a plan view of the first sacrificial roof layer portion.

The method may include the following step: forming a second sacrificial roof layer portion between the first roof layer portion and the second roof layer portion, the second sacrificial roof layer portion being spaced from the first sacrificial roof layer portion and being part of the roof layer material layer.

The method may include the following step: forming a transistor that overlaps the substrate, wherein the first sacrificial roof layer portion may overlap the transistor.

The method may include the following step: forming a gate line that is electrically connected to a gate electrode of the transistor, wherein the first sacrificial roof layer portion may extend parallel to the gate line.

An embodiment of the present invention may be related to a display device, e.g., a liquid crystal display device, that may include the following elements: a substrate; a thin film transistor disposed on the substrate; a pixel electrode connected with an electrode of the thin film transistor; a common electrode overlapping the pixel electrode; a lower insulating layer disposed on the common electrode; and a roof layer disposed on the lower insulating layer. A microcavity with a liquid crystal injection hole is formed between the pixel electrode and the common electrode and contains a liquid crystal layer containing liquid crystal molecules. A lateral surface of the common electrode and/or a lateral surface of the lower insulating layer may be disposed on a same surface and/or in a same plane as a lateral surface of the roof layer, may be spaced from the lateral surface of the roof layer toward the microcavity, and/or may be disposed between the roof layer and the substrate in a direction perpendicular to a surface (e.g., bottom surface or top surface) of the substrate.

The liquid crystal display may include an upper insulating layer disposed on the roof layer, and a lateral surface of the upper insulating layer may be disposed on a same surface and/or in a same plane as the lateral surfaces of the lower insulating layer and the roof layer.

The liquid crystal display may include a capping layer disposed on the upper insulating layer and covering the liquid crystal injection hole. The capping layer may directly contact the lateral surface of the roof layer. The capping layer may directly contact an upper surface of the roof layer.

The microcavity may include a plurality of regions corresponding to a plurality of pixel areas. A liquid crystal injection hole forming region may be formed between the plurality of regions. The capping layer may cover the liquid crystal injection hole forming region.

The liquid crystal injection hole forming region may extend parallel to a gate line that is connected to the thin film transistor.

The liquid crystal display may include an upper insulating layer disposed on the roof layer. The upper insulating layer may cover the lateral surface of the roof layer.

The lateral surface of the lower insulating layer may be in contact with the upper insulating layer at an edge of (the lateral surface of) the roof layer.

The lateral surface of the common electrode and/or the lateral surface of the lower insulating layer may form a recess that is concave with respect to a plane that contains the lateral surface of the roof layer and/or is concave with respect to the substrate.

The liquid crystal display may include a capping layer disposed on the upper insulating layer and covering the liquid crystal injection hole. The capping layer may cover the recess.

The microcavity may include a plurality of regions corresponding to the pixel areas. A liquid crystal injection hole forming region may be formed between the plurality of regions. The capping layer may cover the liquid crystal injection hole forming region.

The liquid crystal injection hole forming region may extend parallel to a gate line that is connected to the thin film transistor.

The recess may extend parallel to the gate line.

An embodiment of the present invention may be related to a method for manufacturing a display device, e.g., a liquid crystal display device. The method may include the following steps: forming a thin film transistor on a substrate; forming a pixel electrode to be connected with an electrode of the thin film transistor; forming a sacrificial layer on the pixel electrode; forming a common electrode on the sacrificial layer; forming a lower insulating layer on the common electrode; forming a roof layer on the lower insulating layer; patterning the lower insulating layer and the common electrode layer using a mask, wherein a lateral surface of the roof layer coincides with, is aligned with, or protrude beyond an edge of the mask; forming a microcavity that has a liquid crystal injection hole by removing the sacrificial layer; injecting a liquid crystal material into the microcavity; and forming a capping layer on the roof layer to cover the liquid crystal injection hole.

The step of forming the roof layer may include exposing a portion of an upper surface of a roof layer material using a photo process. The portion may be parallel to a gate line that is connected to the thin film transistor.

The method may include forming an upper insulating layer on the roof layer. The upper insulating layer may cover the lateral surface of the roof layer and an upper surface portion of the lower insulating layer that is exposed by the roof layer.

The upper insulating layer may be patterned in the patterning of the lower insulating layer and the common electrode. The portion of the upper insulating layer that covers the lateral surface of the roof layer may be removed, so that the lateral surface of the roof layer may be exposed.

The capping layer may directly contact the lateral surface of the roof layer and/or the upper surface of the roof layer.

The microcavity may include a plurality of regions corresponding to pixel areas of the liquid crystal display. A liquid crystal injection hole forming region may be formed between the plurality of regions. The capping layer may cover the liquid crystal injection hole forming region.

The liquid crystal injection hole forming region may extend parallel to a gate line that is connected to the thin film transistor.

An embodiment of the present invention may be related to a method for manufacturing a display device, e.g., a liquid crystal display device. The method may include the following steps: forming a thin film transistor on a substrate; forming a pixel electrode to be connected with an electrode of the thin film transistor; forming a sacrificial layer on the pixel electrode; forming a common electrode on the sacrificial layer; forming a lower insulating layer on the common electrode; forming a roof layer including a sacrificial roof pattern (or sacrificial roof portion) on the lower insulating layer; patterning the lower insulating layer and the common electrode using the roof layer as a mask; forming an upper insulating layer on the roof layer; forming a microcavity formed with a liquid crystal injection hole by removing the sacrificial layer; injecting a liquid crystal material into the microcavity; and forming a capping layer on the upper insulating layer to cover the liquid crystal injection hole. The lower insulating layer and the common electrode (and the liquid crystal material) may form a recess that is concave with respect to a plane that contains a lateral surface of the roof layer and/or is concave with respect to the substrate.

The microcavity may include a plurality of regions corresponding to the pixel areas of the display device. A liquid crystal injection hole forming region may be formed between the plurality of regions. The sacrificial roof pattern may be disposed in the liquid crystal injection hole forming region.

The sacrificial roof pattern may be formed separately from a portion of the roof layer that overlaps the pixel electrode.

The sacrificial roof pattern may extend parallel to a gate line that is connected to the thin film transistor.

The sacrificial roof pattern may have a straight shape and/or a saw tooth shape in a plan view of the sacrificial roof pattern.

The sacrificial roof pattern may include discrete islands formed in the liquid crystal injection hole forming region.

An edge of the lower insulating layer may meet the lowermost edge of the lateral surface of the roof layer.

An upper surface portion of the sacrificial layer may be exposed between the pixel-electrode-overlapping portion of the roof layer and the sacrificial roof pattern.

The upper insulating layer may extend on the roof layer and may cover the lateral surface of the roof layer. A sacrificial insulating layer pattern (of sacrificial insulating layer portion) may be formed on the exposed upper surface portion of the sacrificial layer.

A chemical injection hole for removing the sacrificial layer may be formed between the sacrificial insulating layer pattern and at least one of a portion of the roof layer, a portion of the lower insulating layer, and a portion of the common electrode.

In removing the sacrificial layer, the sacrificial roof pattern and the sacrificial insulating layer pattern may be lifted off The method may include ashing (a portion of) the sacrificial layer before the step of forming the upper insulating layer.

According to embodiments of the present invention, a common electrode may not protrude beyond a roof layer or a plane that contains a lateral surface of the roof layer. Therefore, potential sagging of the common electrode may be prevented, such that unwanted short circuit may be prevented. Advantageously, satisfactory quality of a display device may be provide.

According to embodiments of the present invention, chemical injection holes may be formed for facilitating and/or controlling the removal of a sacrificial layer. Advantageously, the process of manufacturing a display device may be optimized

DETAILED DESCRIPTION OF THE EMBODIMENTS

Figure 1:
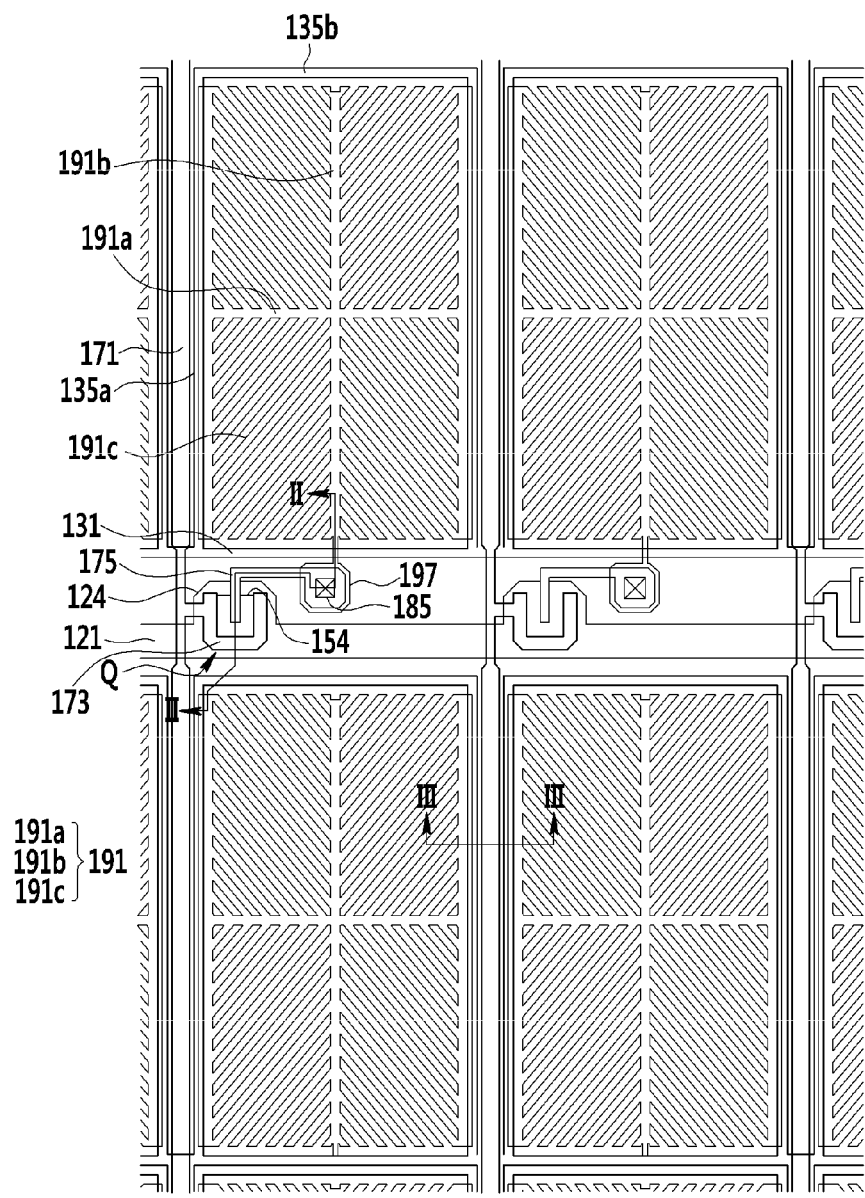
FIG. 1 is a top plan view illustrating a liquid crystal display device (or liquid crystal display) according to an embodiment of the present invention.

Embodiments of the present invention are described in detail with reference to the accompanying drawings. The present invention is not limited to the embodiments described herein and may be embodied in other ways.

Although the terms "first", "second", etc. may be used herein to describe various signals, elements, components, regions, layers, and/or sections, these signals, elements, components, regions, layers, and/or sections should not be limited by these terms. These terms may be used to distinguish one signal, element, component, region, layer, or section from another signal, region, layer, or section. Thus, a first signal, element, component, region, layer, or section discussed below may be termed a second signal, element, component, region, layer, or section without departing from the teachings of the present invention. The description of an element as a "first" element may not require or imply the presence of a second element or other elements. The terms "first", "second", etc. may also be used herein to differentiate different categories of elements. For conciseness, the terms "first", "second", etc. may represent "first-type (or first-category)", "second-type (or second-category)", etc., respectively.

The thicknesses of the layers and/or regions may be exaggerated for clarity in the drawings. If a first element is described to be "on" a second element, the first element may be directly on the second element, or a third element may be disposed between the first element and the second element. Like reference numerals may indicate identical elements or analogous elements in the description.

In the description, the term "connect" may mean "electrically connect"; the term "insulate" may mean "electrically insulate".

Figure 2:
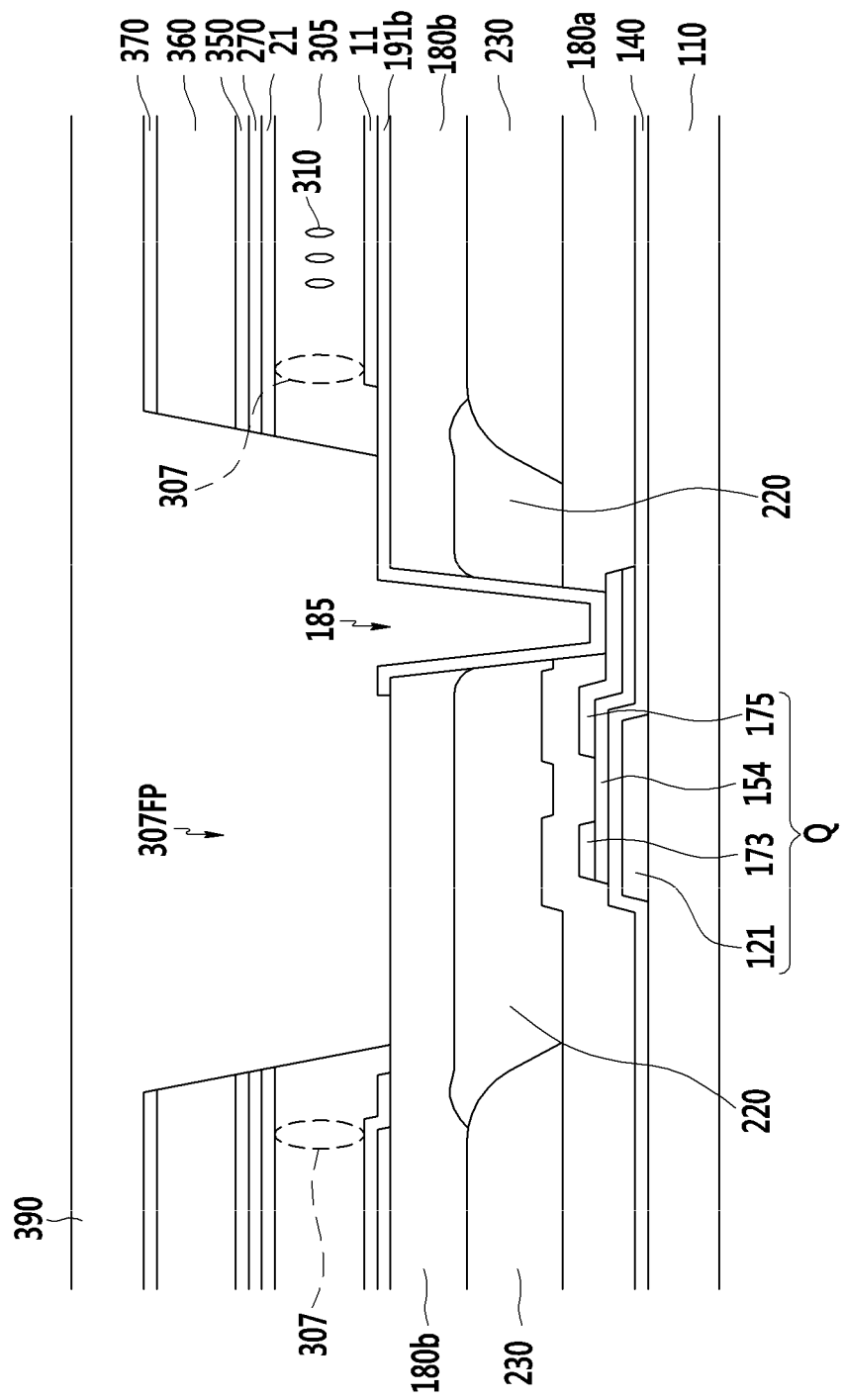
FIG. 2 is a cross-sectional view taken along line II-II indicated in FIG. 1.
Figure 3:
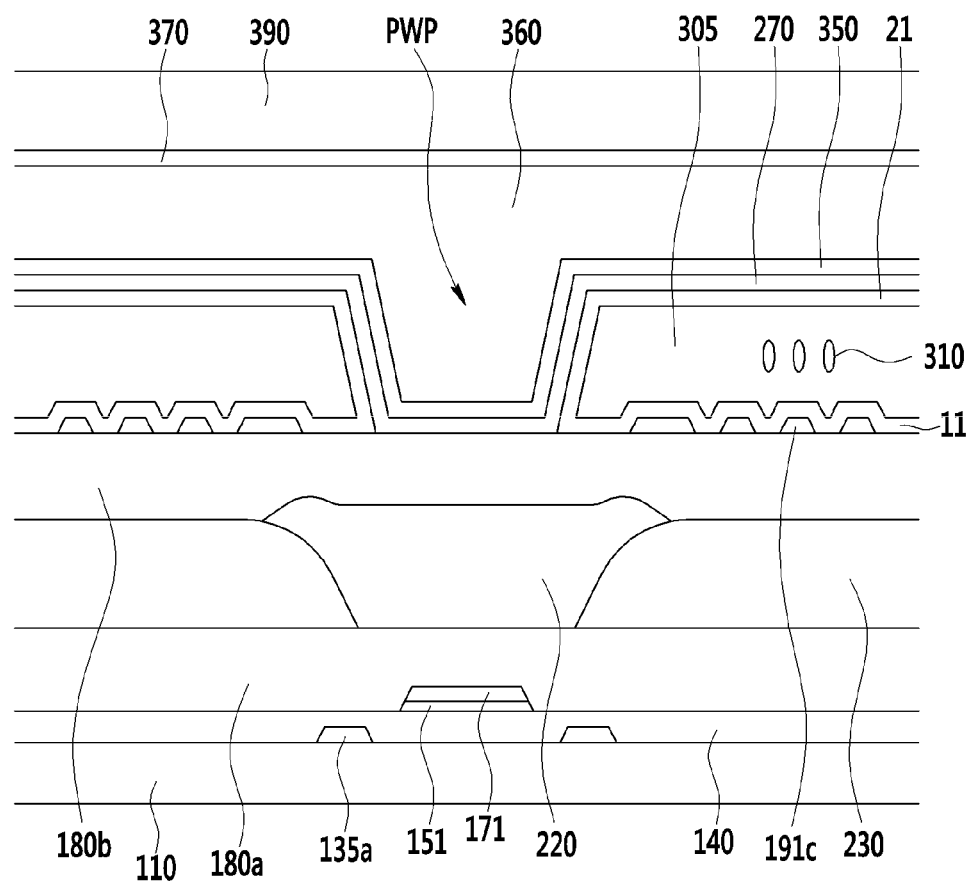
FIG. 3 is a cross-sectional view taken along line III-III indicated in FIG. 1.

FIG. 1 is a top plan view illustrating a liquid crystal display device (or liquid crystal display) according to an embodiment of the present invention. FIG. 2 is a cross-sectional view taken along line II-II indicated in FIG. 1. FIG. 3 is a cross-sectional view taken along line III-III indicated in FIG. 1.

Referring to FIGS. 1 to 3, a gate line 121 and a storage electrode line 131 are formed on an insulation substrate 110 made of transparent glass or plastic. The gate line 121 includes a gate electrode 124 and may transmit a gate signal. The storage electrode line 131 generally extends transversely and may transmit a predetermined voltage such as a common voltage Vcom. The storage electrode line 131 includes a pair of vertical portions 135a extending substantially perpendicular to the gate line 121a and a horizontal portion 135b connecting the ends of the pair of vertical portions 135a. Portions of the storage electrode line 131, including portions 135a and 135b, may surround a pixel electrode 191 in the top plan view of the liquid crystal display.

A gate insulating layer 140 is formed on the gate line 121 and the storage electrode line 131. A semiconductor layer 154 is disposed on the gate insulating layer 140. A source electrode 173 and a drain electrode 175 are disposed on the semiconductor layer 154. The gate line 121, the semiconductor layer 154, the source electrode 173, and the drain electrode 175 may form a thin film transistor Q. The semiconductor layer 154 may include a channel portion that does not overlap the source electrode 173 and the drain electrode 175.

A semiconductor layer 151 is disposed on the gate insulating layer 140. A data line 171 is disposed on the semiconductor layer 151 and may transmit a data voltage. One or more ohmic contacts (not illustrated) may be formed between the data line 171 and the electrodes 173 and 175 and/or may be formed on at least one of the semiconductor layers 151 and 154. The data line 171 and the electrodes 173 and 175 are data conductors.

A first interlayer insulating layer 180a is formed on the data conductors 171, 173, and 175 and the exposed portion of the semiconductor layer 154. The first interlayer insulating layer 180a may contain an inorganic insulator, such as at least one of a silicon nitride (SiNx) and silicon oxide (SiOx), or an organic insulator.

A color filter 230 and a light blocking member 220 are formed on the first interlayer insulating layer 180a.

The light blocking member 220 has a lattice structure with an opening corresponding to a region where an image is displayed. The light blocking member 220 is made of a material that does not transmit light. The color filter 230 is formed in the opening of the light blocking member 220.

The color filter 230 may exhibit one of three primary colors of red, green, and blue. In an embodiment, the color filter may exhibit one of cyan, magenta, yellow, and white series colors. The color filters 230 of adjacent pixels may display different colors.

A second interlayer insulating layer 180b is formed on the color filter 230 and the light blocking member 220 to cover the color filter 230 and the light blocking member 220. The second interlayer insulating layer 180b may contain an inorganic insulator, such as at least one of silicon nitride (SiNx) and silicon oxide (SiOx), or an organic insulator. In an embodiment, a step may exist due to the difference between the thickness of the color filter 230 and the thickness of the light blocking member 220. The step can be reduced or removed by an organic insulator that overlaps the second interlayer insulating layer 180b.

A contact hole 185 exposing the drain electrode 175 is formed through one or more of the color filter 230, the light blocking member 220, and the interlayer insulating layers 180a and 180b.

A pixel electrode 191 is formed on the second interlayer insulating layer 180b. The pixel electrode 191 may be made of a transparent conductive material, such as ITO or IZO.

The entire shape of the pixel electrode 191 is substantially a rectangle. The pixel electrode 191 includes a cross stem portion composed of a horizontal stem portion 191a and a vertical stem portion 191b crossing the horizontal stem portion 191a. The pixel electrode includes four sub-regions defined by the horizontal stem portion 191a and the vertical stem portion 191b, and each of the sub-regions includes a plurality of fine branches 191c. In an embodiment, the pixel electrode 191 may further include a portion that surrounds the portions 191a, 191b, and 191c.

A fine branch 191c of the pixel electrode 191 may be disposed at an angle of about 40 degrees to 45 degrees with respect to the gate line 121 or the horizontal stem portion 191a in the top plan view of the liquid crystal display. Two fine branches of adjacent two sub-regions may be perpendicular to each other. The width of a fine branch 191c may gradually increase. Gaps between fine branches 191c may be have different sizes.

The pixel electrode 191 has an extension 197 connected to the lower end of the vertical stem portion 191b and having a width larger than that of the vertical stem portion 191b. The extension 197 of the pixel electrode 191 is physically and electrically connected to the drain electrode 175 through the contact hole 185. The pixel electrode 191 may receive a data voltage from the drain electrode 175.

The structures of the thin film transistor Q and the pixel electrode 191 may be modified according to particular embodiments of the invention.

A lower alignment layer 11 is formed on the pixel electrode 191 and may be a vertical alignment layer. The lower alignment layer 11 may be configured to align (or orient) liquid crystal molecules. The lower alignment layer 11 may contain at least one of polyamic acid, polysiloxane, and polyimide and/or may contain at least one of materials that are generally used for alignment purposes.

An upper alignment layer 21 is disposed opposite the lower alignment layer 11, and a microcavity 305 is formed between the lower alignment layer 11 and the upper alignment layer 21. The microcavity 305 is filled with a liquid crystal material containing liquid crystal molecules 310 and has a liquid crystal injection hole 307. The microcavity 305 may extend in the pixel column direction of the liquid crystal display, which may be a vertical direction that is substantially perpendicular to a top edge of the liquid crystal display when the liquid crystal display is in normal use. In an embodiment, the alignment material for forming the alignment layers 11 and 21 and the liquid crystal material containing the liquid crystal molecules 310 may be injected into the microcavity 305 through capillary action.

Microcavities 305 may be (e.g., vertically) separated by a plurality of liquid crystal injection hole forming regions 307FP that may overlap gate lines 121 and may extend parallel to the gate lines 121. Each of the microcavityies 305 may correspond to one, two, or more of pixel areas, wherein the pixel areas may correspond to the regions where an image is displayed.

A common electrode 270 and a lower insulating layer 350 are disposed on the upper alignment layer 21. The common electrode 270 may receive a common voltage and may generate an electric field together with the pixel electrode 191, which may receive a data voltage, so that the inclination direction of the liquid crystal molecules 310 may be controlled. The common electrode 270 and the pixel electrode 191 may form a capacitor, which may keep the applied voltage(s) even after the thin film transistor Q is turned off. The lower insulating layer 350 may be made of silicon nitride (SiNx) or silicon oxide (SiO2).

In an embodiment of the present invention, as illustrated in FIG. 2, microcavities 305 are formed between the common electrode 270 and the substrate 110. In an embodiment, the common electrode 270 may be formed between the microcavity 305 and the substrate 110, such that the liquid crystal display may operate according to a coplanar electrode (CE) mode.

A roof layer 360 is disposed on the lower insulating layer 350. The roof layer 360 serves to support and/or define the shape of a microcavity 305. The roof layer 360 may contain one or more photoresist and/or organic materials.

The upper insulating layer 370 is disposed on the roof layer 360. The upper insulating layer 370 may be in direct contact with the upper surface of the roof layer 360. The upper insulating layer 370 may be made of silicon nitride (SiNx) or silicon oxide (SiO2).

In an embodiment, some of the common electrode 270, the lower insulating layer 350, the roof layer 360, and the upper insulating layer 370 may coincide with and/or may be aligned with each other at edges, as can be appreciated from FIG. 2. Lateral surfaces of the common electrode 270, the lower insulting layer 350, the roof layer 360, and the upper insulating layer 370 may be connected to form one flat surface. Two or more of a lateral surface (or edge surface) of the common electrode 270, a lateral surface (or edge surface) of the lower insulting layer 350, a lateral surface (or edge surface) of the roof layer 360, and a lateral surface (or edge surface) of the upper insulating layer 370 may be positioned and aligned in a same plane. The plane may be oriented at an acute angle or a right angle with respect to the substrate 110.

As can be appreciated from FIG. 2, the minimum distance between two immediately neighboring portions of the common electrode 270 may be less than or equal to the minimum distance between two immediately neighboring portions of the upper alignment layer 21. The minimum distance between two immediately neighboring portions of the lower insulating layer 350 (or between two immediately neighboring lower insulating layers 350) may be less than or equal to the minimum distance between two immediately neighboring portions of the common electrode 270. The minimum distance between two immediately neighboring portions of the roof layer 360 (or between two immediately neighboring roof layers 360) may be less than or equal to the minimum distance between two immediately neighboring portions of the lower insulating layer 350 (or between two immediately neighboring lower insulating layers 350). The minimum distance between two immediately neighboring portions of the upper insulating layer 370 (or between two immediately neighboring upper insulating layers 370) may be less than or equal to the minimum distance between two immediately neighboring portions of the roof layer 360 (or between two immediately neighboring roof layers 360).

A first portion (e.g., the right portion illustrated in FIG. 2) of the roof layer 360 immediately neighbors a second portion (e.g., the left portion of the roof layer 360 in FIG. 2). A first portion (e.g., the right portion illustrated in FIG. 2) of the common electrode 270 overlaps the first portion of the roof layer 360. A second portion (e.g., the right portion illustrated in FIG. 2) of the common electrode 270 immediately neighbors the first portion of the common electrode 270 and overlaps the second portion of the roof layer 360. A first portion (e.g., the right portion illustrated in FIG. 2) of the lower insulating layer 350 overlaps the first portion of the roof layer 360. A second portion (e.g., the right portion illustrated in FIG. 2) of the lower insulating layer 350 immediately neighbors the first portion of the lower insulating layer 350 and overlaps the second portion of the roof layer 360.

A lateral surface of the first portion of the roof layer 360 is position in a first plane. A lateral surface of the second portion of the roof layer 360 is position in a second plane. The minimum distance between a lateral surface of the first portion of the common 270 and a lateral surface of the second portion of the common electrode 270 is greater than or equal to the minimum distance between the first plane and the second plane. The common electrode 270 may not protrude over the first plane or the second plane. The minimum distance between a lateral surface of the first portion of the lower insulating layer 350 and a lateral surface of the second portion of the lower insulating layer 350 is greater than or equal to the minimum distance between the first plane and the second plane. The lower insulating layer 350 may not protrude over the first plane or the second plane.

The minimum distance between the first plane and the second plane may be equal to zero given that the first plane and the second plane may cross each other.

One or more lateral surfaces of the roof layer 360 may be exposed without being covered by the upper insulating layer 370.

A capping layer 390 is disposed on the upper insulating layer 370. In an embodiment, the capping layer 390 is in direct contact with the upper surface and the lateral surfaces of the upper insulating layer 370 and is in direct contact with the exposed lateral surface(s) of the roof layer 360.

The capping layer 390 fills the liquid crystal injection hole forming region 307FP and covers the liquid crystal injection hole 307 of the microcavity 305. The capping layer 390 may be made of thermosetting resin, silicon oxycarbide (SiOC), or graphene.

An overcoat (not illustrated), which is made of an inorganic film or an organic film, may be disposed on the capping layer 390. The overcoat serves to protect the liquid crystal molecules 310 injected in the microcavity 305 against an external shock and/or to planarize a surface of the liquid crystal display.

In an embodiment, as illustrated in FIG. 3, a partition wall portion PWP is formed between immediately and horizontally adjacent microcavityies 305. The partition wall portion PWP may be formed in the extension direction of a data line 171 and may be covered with (or covered by) the roof layer 360. The partition wall portion PWP is disposed between two portions of the lower insulating layer 350, between two portions of the common electrode 270, and between the upper insulating layer 370 and/or the roof layer 360 and a portion of the lower insulating layer 350 and/or a portion of the common electrode 270. Microcavities 305 can be separated or defined by partition wall portions PWP.

A lower polarizer (not illustrated) may be disposed under the insulating substrate 110, and an upper polarizer (not illustrated) may be disposed on the upper insulating layer 370. Each of the polarizers may include a polarization device for performing polarization and may include a TAC (Tri-acetyl-cellulose) layer for ensuring durability. The transmissive axes of the upper polarizer and the lower polarizer may be perpendicular or parallel, according to particular embodiments.

Figure 4:
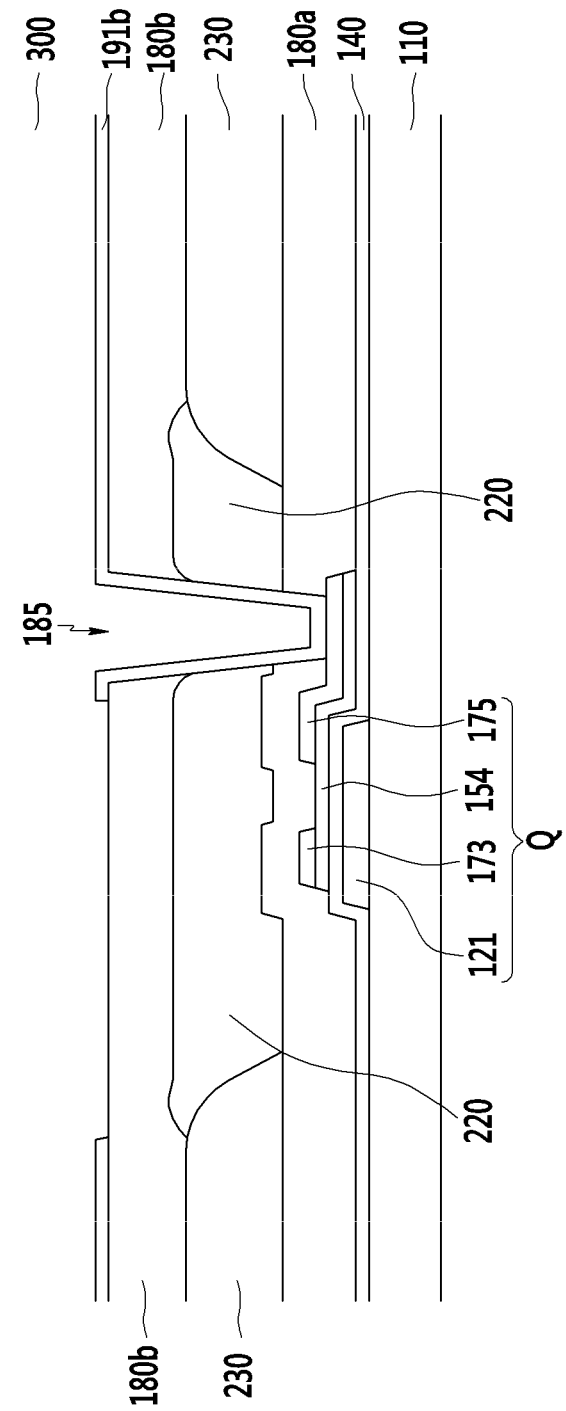
FIGS. 4 to 11 are cross-sectional views illustrating a method for manufacturing a liquid crystal display according to an embodiment of the present invention.
Figure 5:
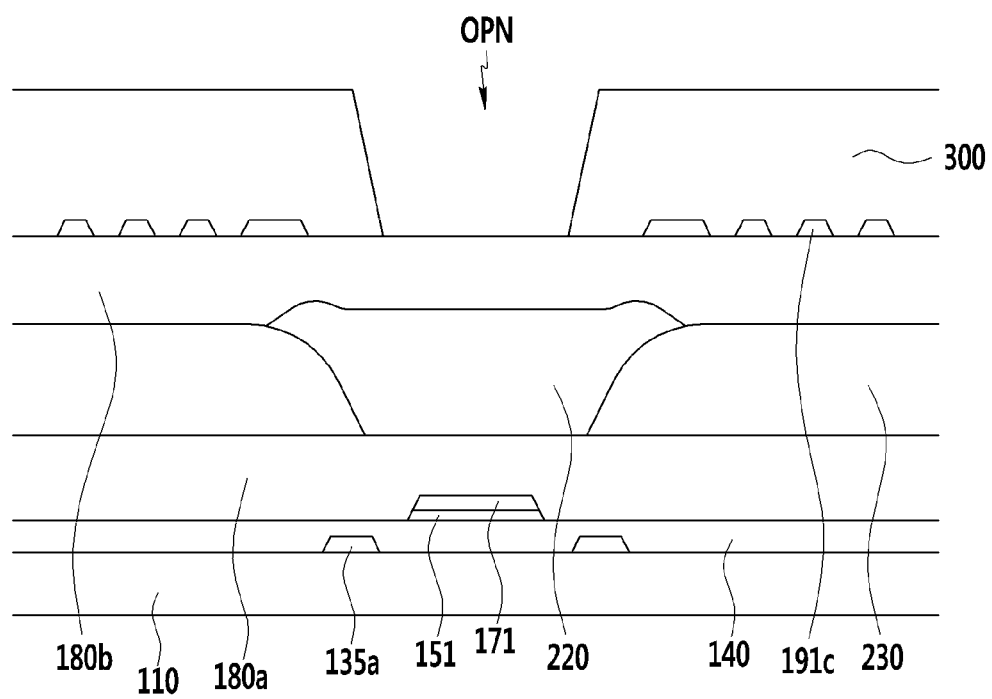

FIGS. 4 to 11 are cross-sectional views illustrating a method for manufacturing a liquid crystal display according to an embodiment of an invention. FIGS. 4 and 6 to 11 are taken along a line at a position analogous to the position of the line II-II indicated in FIG. 1. FIG. 5 is taken along a line at a position analogous to the position of the line III-III indicated in FIG. 1.

Referring to FIGS. 1, 4, and 5, the gate line 121 and the gate insulating layer 140 are formed on the substrate 110, the semiconductor layers 151 and 154 are formed on the gate insulating layer 140, and the source electrode 173 and the drain electrode 175 are formed to partially overlap the semiconductor layer 154. The data line 171 may be connected with the source electrode 173 and may cross the gate line 121.

The first interlayer insulating layer 180a is formed on the exposed portion of the semiconductor layer 154 and the data conductors 171, 173, and 175 (i.e., the source electrode 173, the drain electrode 175, and the data line 171).

The color filters 230 are formed at the positions corresponding to the pixel areas on the first interlayer insulating layer 180a. The light blocking member 220 is formed between the color filters 230.

The second interlayer insulating layer 180b (for covering the color filters 230 and the light blocking member 220) is formed on the color filters 230 and the light blocking member 220 and has the contact hole 185 for enabling electrical and physical connection between the pixel electrode 191 and the drain electrode 175.

Thereafter, the pixel electrode 191 is formed on the second interlayer insulating layer 180b, and a sacrificial layer 300 is formed on the pixel electrode 191. An open portion OPN is formed in the sacrificial layer 300, as illustrated in FIG. 5. The open portion OPN may be parallel to a data line 171. The open portion OPN may receive the common electrode 270, the lower insulating layer 350, and the partition wall portion PWP. The open portion OPN may be covered by the roof layer 360 and the upper insulating layer 370 in following processes.

Figure 6:
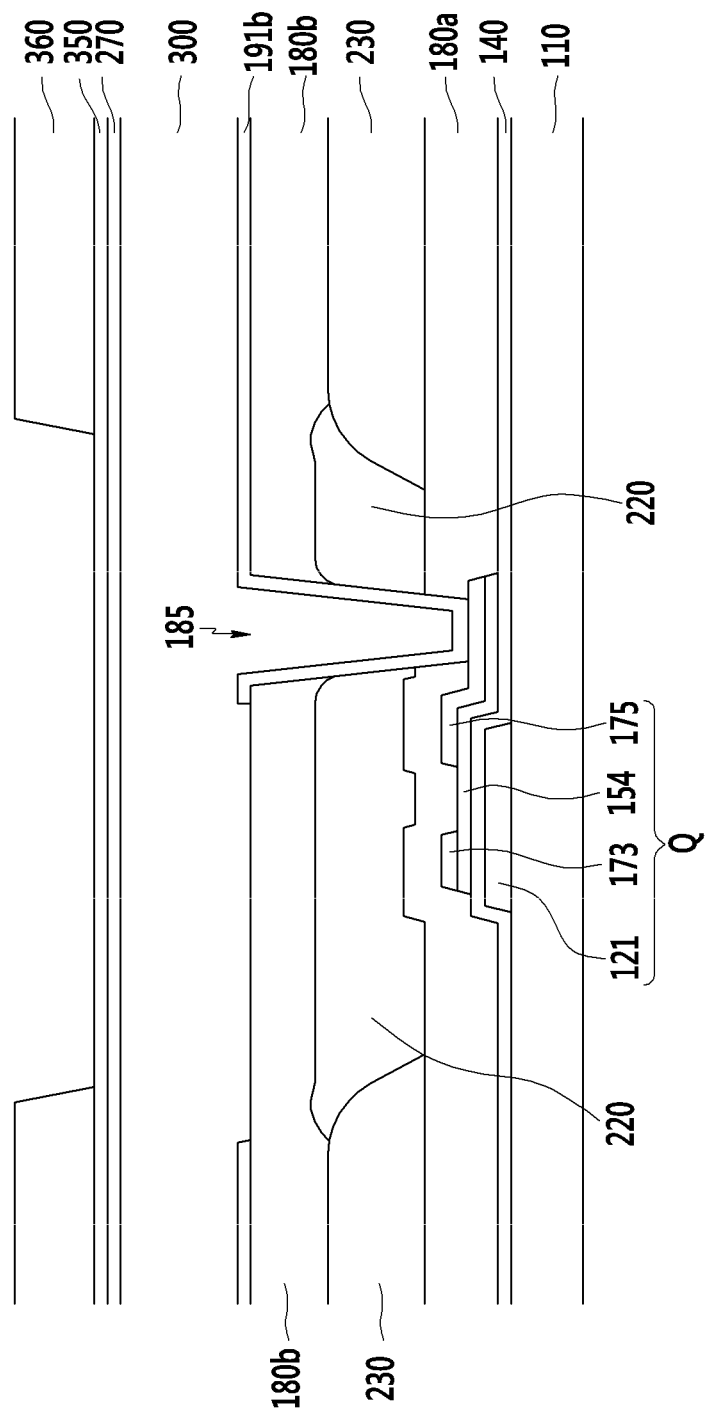

Referring to FIG. 6, a common electrode 270 material layer, a lower insulating layer 350 material layer, and a roof layer 360 material layer are sequentially formed on the sacrificial layer 300. A portion of the roof layer 360 that overlaps the light blocking member 220 and is disposed between immediately and vertically adjacent pixel areas may be removed through exposing and developing processes. Therefore, the roof layer 360 (or roof layers 360) may be formed and may expose a portion of the lower insulating layer 350 material layer that overlaps the light blocking member 220.

Figure 7:
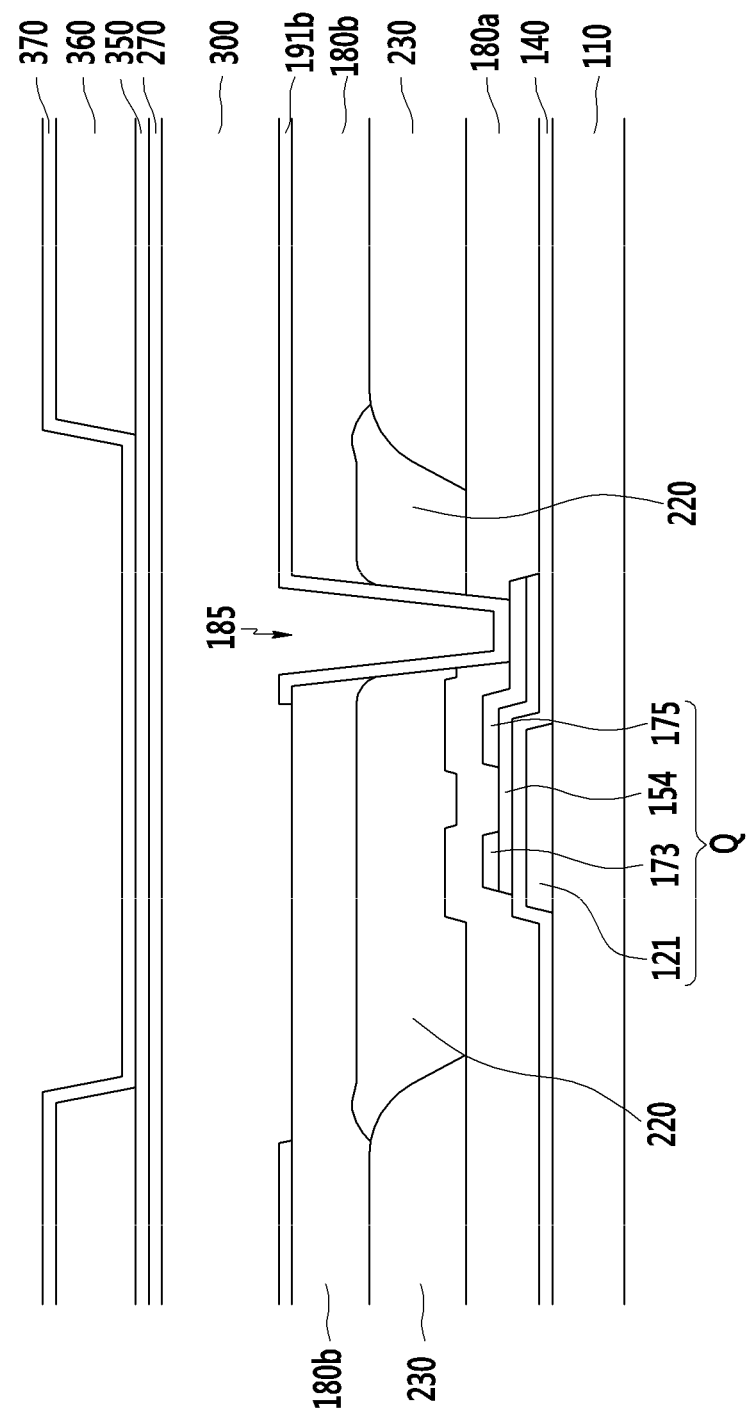

Referring to FIG. 7, an upper insulating layer 370 material layer is formed to cover the roof layer 360 (or roof layers 360) and the exposed portion of the lower insulating layer 350 material layer.

Figure 8:
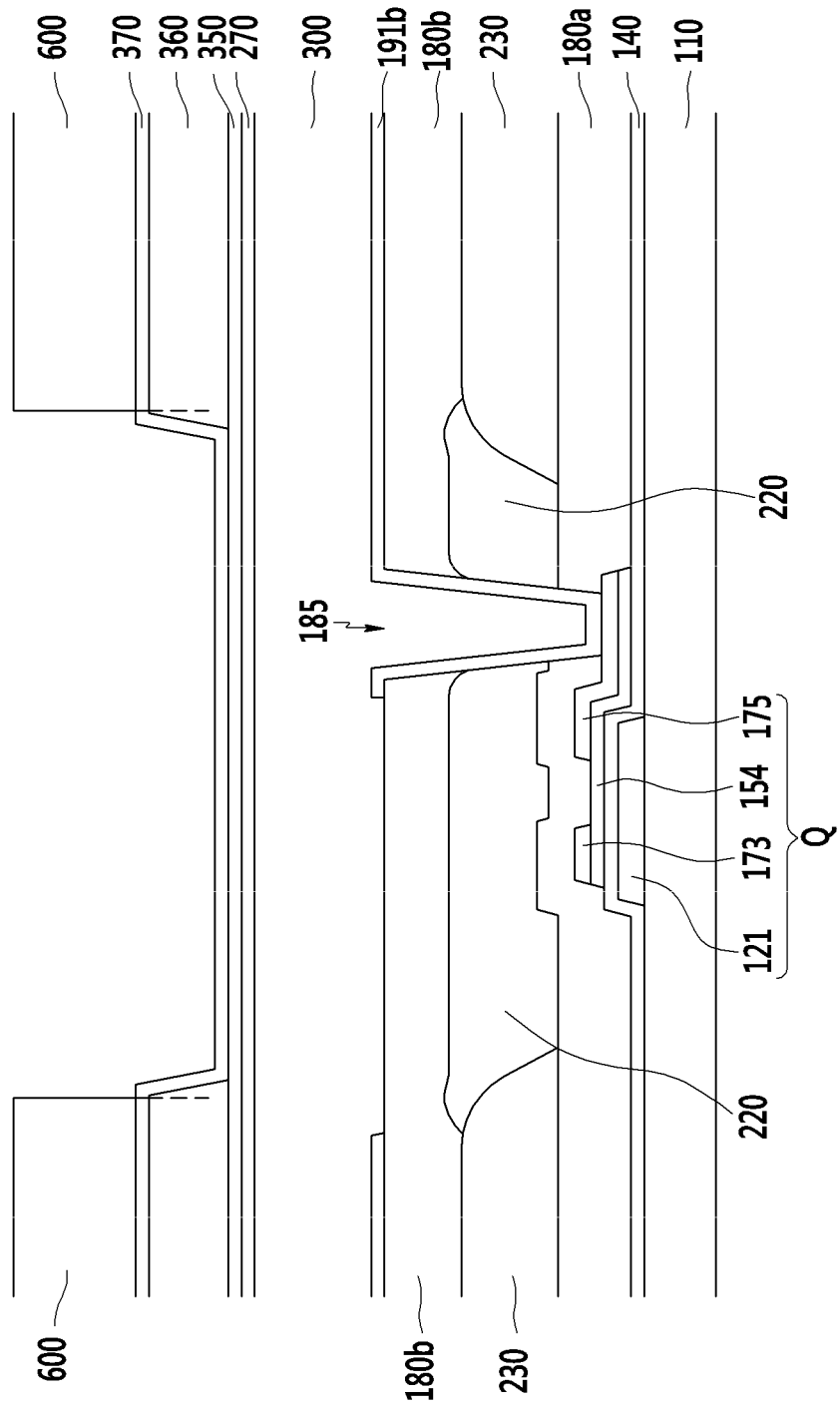

Referring to FIG. 8, an etching mask 600 is disposed on the upper insulating layer 370. Edges of the etching mask 600 may be aligned to substantially coincide with edges of the roof layer 360 in a direction perpendicular to a bottom surface of the substrate 110.

Figure 9:
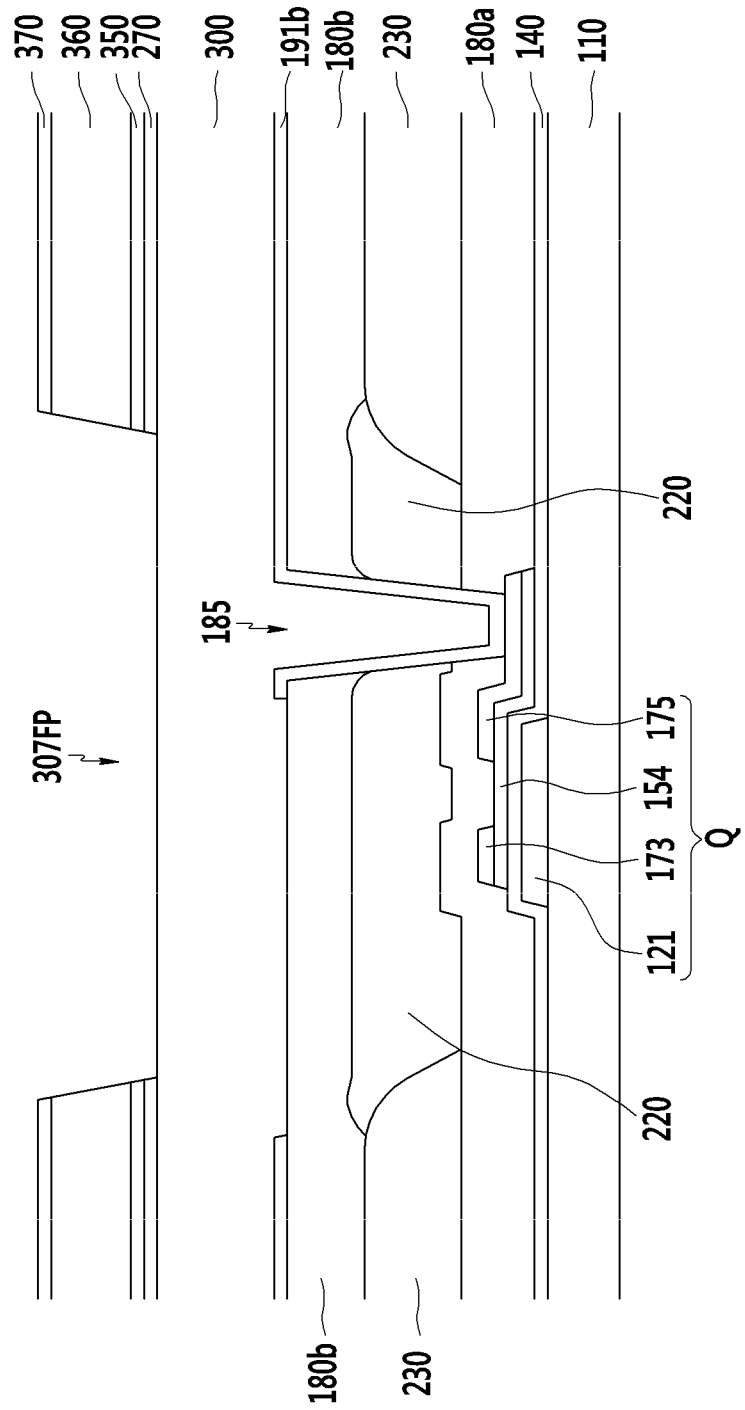

Referring to FIG. 9, dry etching is performed on the upper insulating layer 370 material layer, the lower insulating layer 350 material layer, and the common electrode 270 material layer, using the etching mask 600. As a result, a lateral surface of the upper insulating layer 370, a lateral surface of the roof layer 360, a lateral surface of the lower insulating layer 350, and a lateral surface of the common electrode 270 are disposed in a same plane, without substantial protrusion of the upper insulating layer 370, the lower insulating layer 350, or the common electrode 270 over the plane in a direction perpendicular to the plane. A portion of the upper insulating layer 370 material layer that covers lateral surfaces of the roof layer 360 is removed, and the lateral surfaces of the roof layer 360 are exposed.

As the upper insulating layer 370 material layer, the lower insulating layer 350 material layer, and the common electrode 270 material layer are partially removed, the liquid crystal injection hole forming region 307FP is formed.

Figure 10:
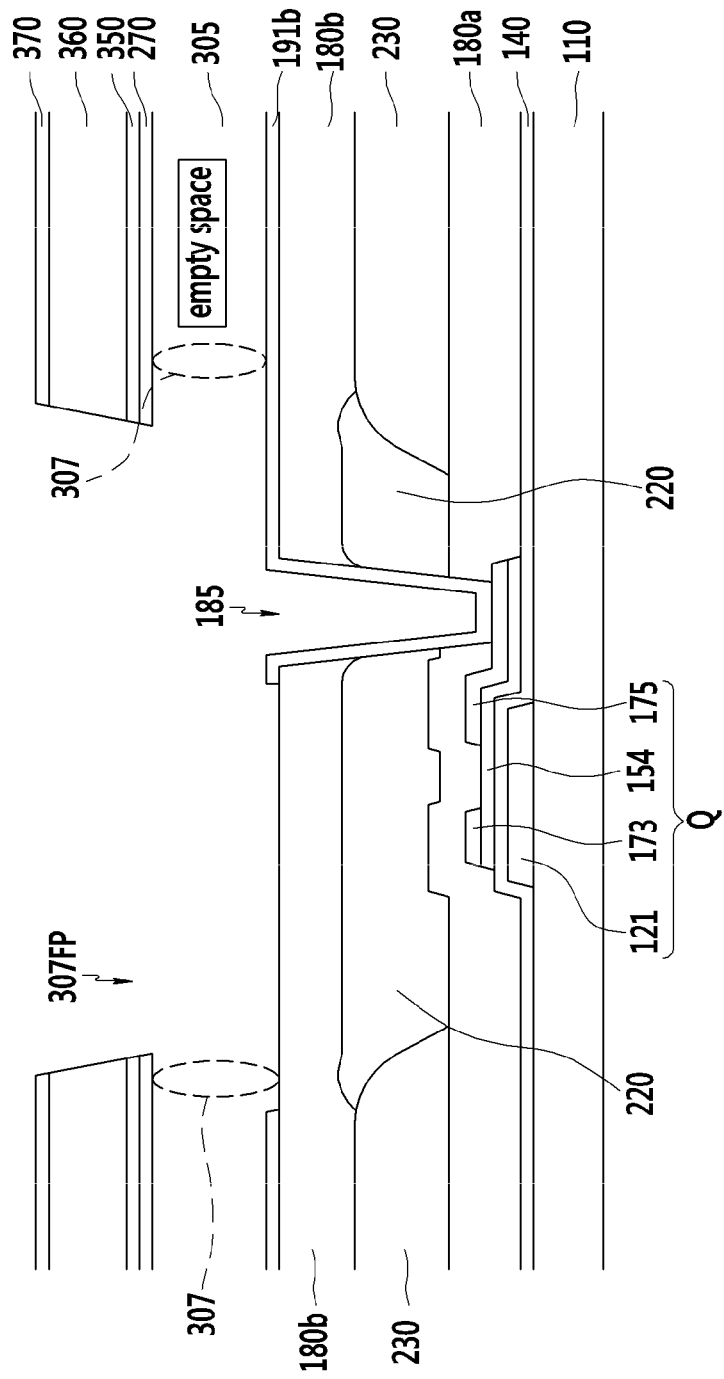

Referring to FIG. 10, the sacrificial layer 300 is removed by oxygen (O2) ashing or wet etching, through the liquid crystal injection hole forming region 307FP. Accordingly, empty microcavities 305 with liquid crystal injection holes 307 are formed.

Figure 11:
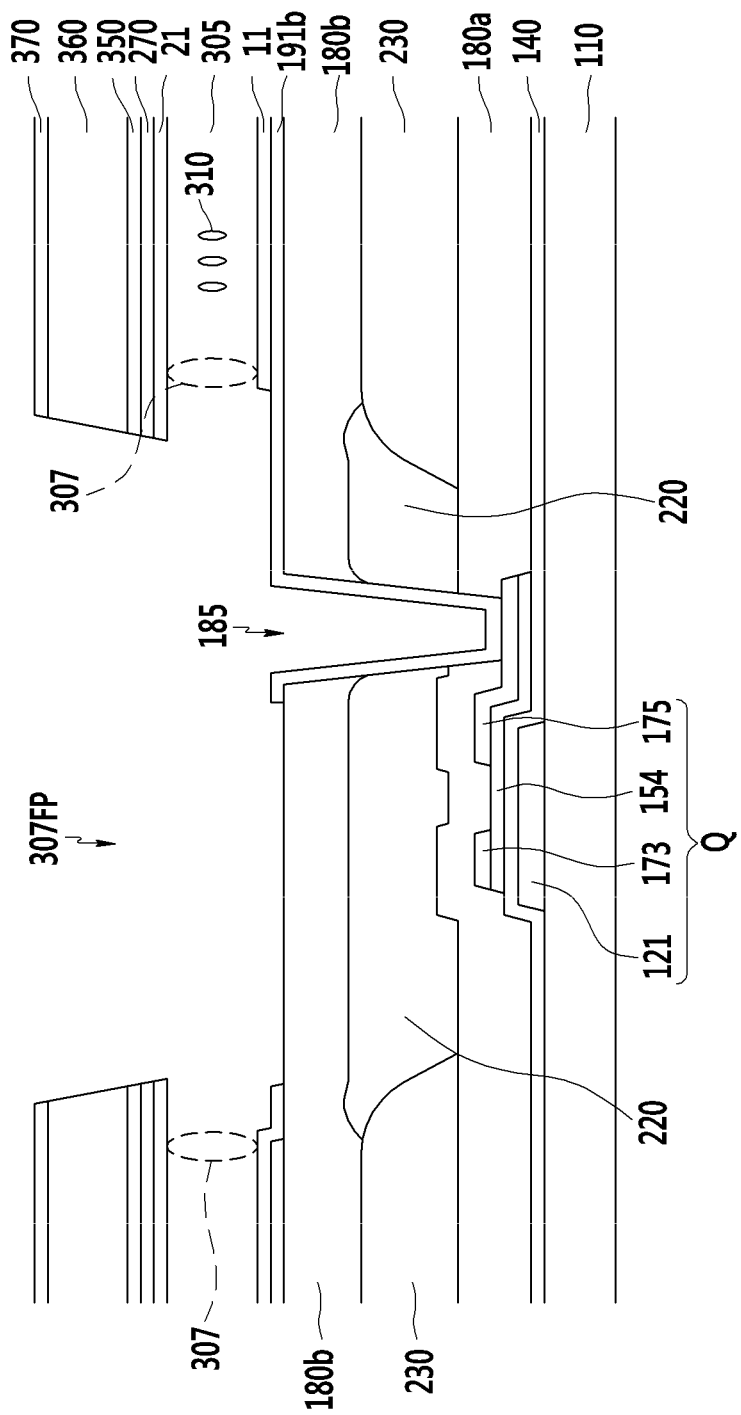

Referring to FIG. 11, the alignment layers 11 and 21 are formed on the pixel electrode 191 and the common electrode 270 by injecting an alignment material through the liquid crystal injection hole 307 and subsequently baking the alignment material. The alignment material may contain a solid and a solvent.

Subsequently, the liquid crystal display illustrated in FIG. 2 is formed by injecting a liquid crystal material containing the liquid crystal molecules 310 into the microcavities 305 through the liquid crystal injection holes 307, for example, using an inkjet method.

Figure 12:
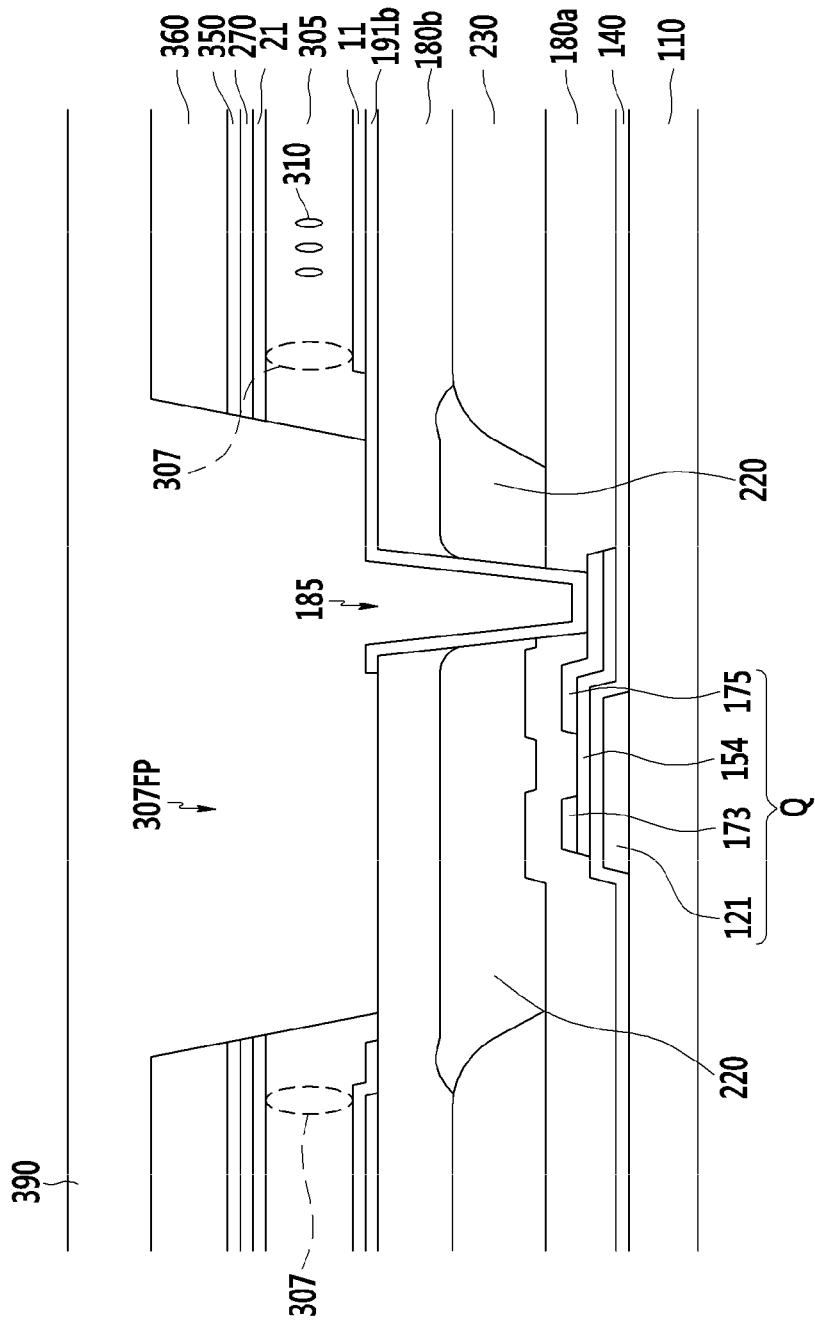
FIG. 12 is a cross-sectional view illustrating a liquid crystal display according to an embodiment of the present invention.

FIG. 12 is a cross-sectional view illustrating a liquid crystal display according to an embodiment of an invention. Some elements and features of the liquid crystal display illustrated in FIG. 12 may be substantially identical to or analogous to some elements and features described with reference to FIGS. 1 to 11. Nevertheless, in the liquid crystal display illustrated in FIG. 12, the upper surface (and the lateral surfaces) of the roof layer 360 are in direct contact with the capping layer 390, without an upper insulating layer 370 being disposed between the capping layer 390 and the upper surface of the roof layer 360. The thickness of the liquid crystal display may be minimized.

Figure 13:
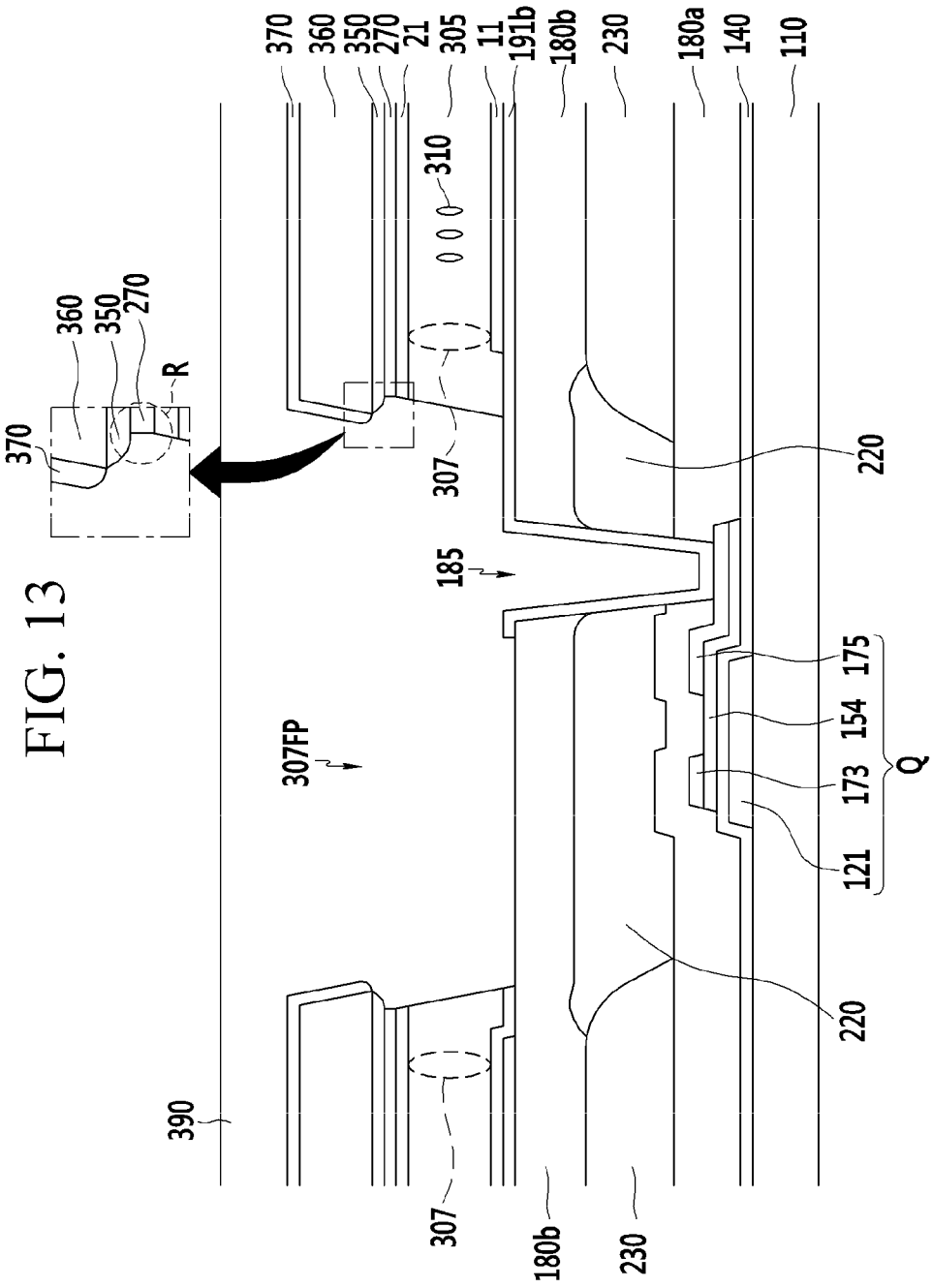
FIG. 13 is a cross-sectional view illustrating a liquid crystal display according to an embodiment of the present invention.

FIG. 13 is a cross-sectional view illustrating a liquid crystal display according to an embodiment of an invention. FIG. 13 is a cross-sectional view taken along line II-II indicated in FIG. 1 according to an embodiment of an invention. Some elements and features of the liquid crystal display illustrated in FIG. 13 may be substantially identical to or analogous to some elements and features described with reference to FIGS. 1 to 12.

Referring to FIG. 13, the minimum distance between lateral surfaces of two immediately neighboring portions of the common electrode 270 may be greater than the minimum distance between lateral surfaces of two immediately neighboring portions of the roof layer 360, the minimum distance between lateral surfaces of two immediately neighboring portions of the common electrode 270 may be greater than or equal to the minimum distance between lateral surfaces of two immediately neighboring portions of the lower insulating layer 350, and the minimum distance between lateral surfaces of the lower insulating layer 350 may be greater than or equal to the minimum distance between lateral surfaces of two immediately neighboring portions of the roof layer 360. In other words, the common electrode 270 and the lower insulating layer 350 are recessed from edges of the roof layer 360, thereby forming recesses R. A recess R may have an inversely tapered shape. The common electrode 270 may be recessed from the roof layer 360 further than the lower insulating layer 350. The recess R is formed along the liquid crystal injection hole forming region 307FP.

A first portion (e.g., the right portion illustrated in FIG. 13) of the roof layer 360 immediately neighbors a second portion (e.g., the left portion of the roof layer 360 in FIG. 13). A first portion (e.g., the right portion illustrated in FIG. 13) of the common electrode 270 overlaps the first portion of the roof layer 360. A second portion (e.g., the right portion illustrated in FIG. 13) of the common electrode 270 immediately neighbors the first portion of the common electrode 270 and overlaps the second portion of the roof layer 360. A first portion (e.g., the right portion illustrated in FIG. 13) of the lower insulating layer 350 overlaps the first portion of the roof layer 360. A second portion (e.g., the right portion illustrated in FIG. 13) of the lower insulating layer 350 immediately neighbors the first portion of the lower insulating layer 350 and overlaps the second portion of the roof layer 360.

A lateral surface of the first portion of the roof layer 360 is position in a first plane. A lateral surface of the second portion of the roof layer 360 is position in a second plane.

The minimum distance between a lateral surface of the first portion of the common 270 and a lateral surface of the second portion of the common electrode 270 is greater than or equal to the minimum distance between the first plane and the second plane. The lateral surface of the first portion of the common 270 may be disposed between (the lateral surface of) the first portion of the roof layer 360 and the substrate 110 in the direction perpendicular to a bottom surface of the substrate 110. The common electrode 270 may not protrude over the first plane or the second plane.

The minimum distance between a lateral surface of the first portion of the lower insulating layer 350 and a lateral surface of the second portion of the lower insulating layer 350 is greater than or equal to the minimum distance between the first plane and the second plane. The lateral surface of the first portion of the lower insulating layer 350 may be disposed between (the lateral surface of) the first portion of the roof layer 360 and the substrate 110 in the direction perpendicular to a bottom surface of the substrate 110. The lower insulating layer 350 may not protrude over the first plane or the second plane.

Portions of the lower insulating layer 350 may cover the entire lower surfaces of the roof layer 360 and may have an inversely tapered shape. The area of the surface of the lower insulating layer 350 that contacts the roof layer 360 may be larger than the area of the surface of the lower insulating layer 350 that contacts the common electrode 270.

The upper insulating layer 370 disposed on the roof layer 360 covers not only the upper surface of the roof layer 360, but also lateral surfaces of the roof layer 360. An edge of the upper insulating layer 370 may be in direct contact with an edge of the lower insulating layer 350.

The capping layer 390 disposed on the upper insulating layer 370 covers the liquid crystal injection hole forming region 307FP and the liquid crystal injection hole 307.

Portions of the capping layer 390 may fill and/or may be disposed inside the recesses R. A corner portion of the roof layer 360 and a lateral surface of the roof layer 360 are disposed between two portions of the capping layer 390.

Figure 14:
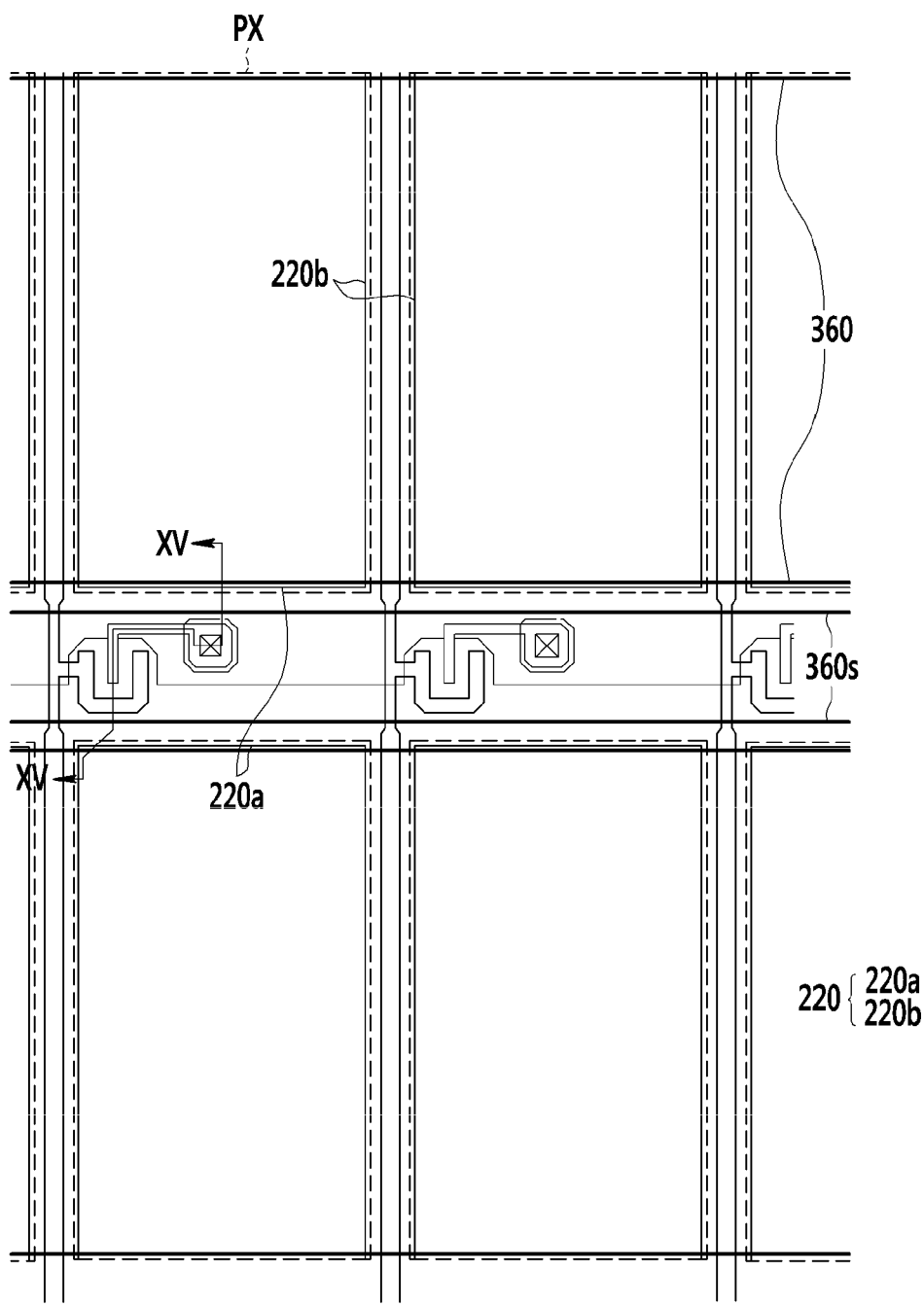
FIGS. 14 to 20 include a top plan view and cross-sectional views illustrating structures and a method for manufacturing a liquid crystal display according to an embodiment of the present invention.
Figure 15:
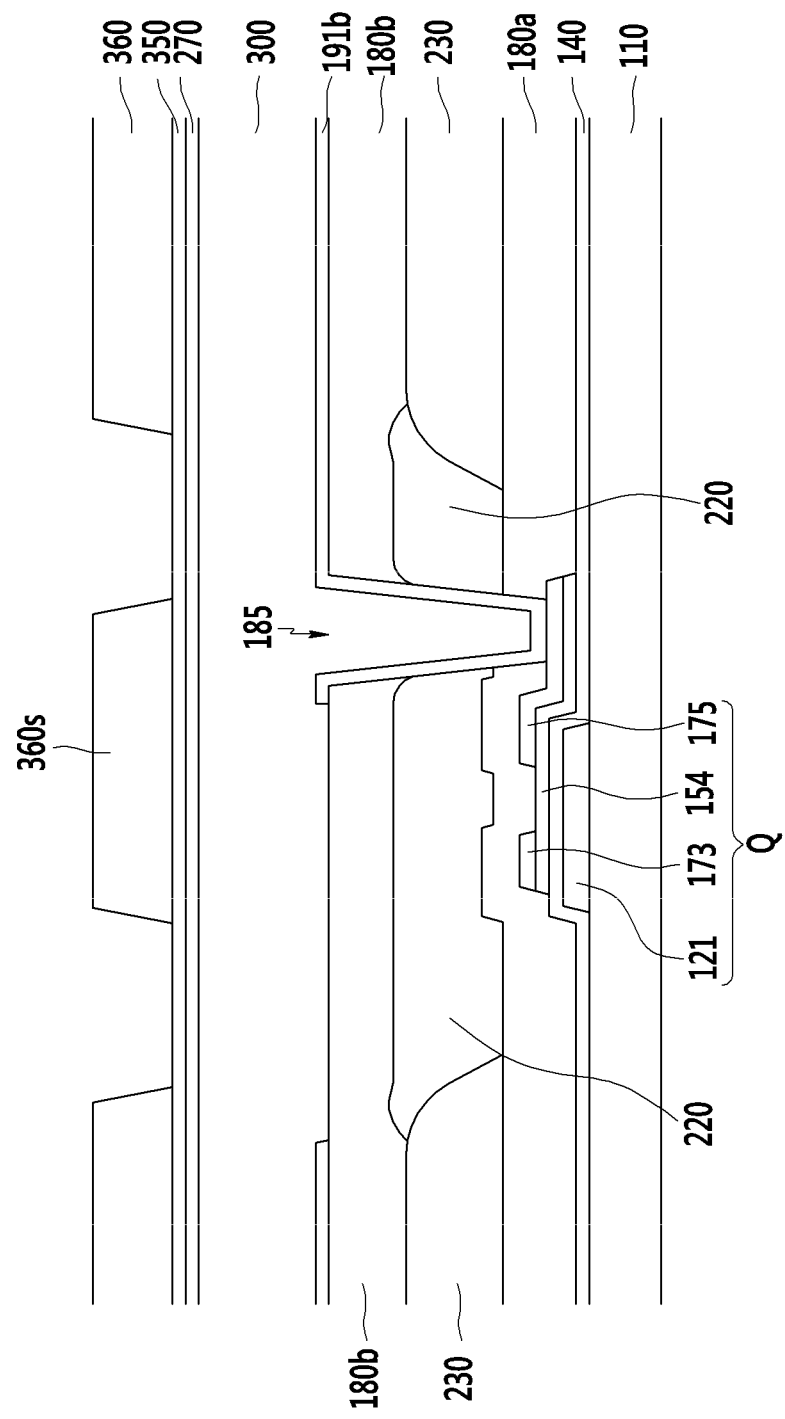

FIGS. 14 to 20 include top plan views and cross-sectional views illustrating structures and a method for manufacturing a liquid crystal display according to an embodiment of an invention. FIG. 14 is a top view illustrating a structures for manufacturing a liquid crystal display that may include elements and features identical to or analogous elements and features illustrated in FIG. 1. FIGS. 15 to 20 are cross-sectional views taken along a line at a position analogous to the position of the line XV-XV indicated in FIG. 14. Some elements, steps, and/or features described with reference to FIGS. 14 to 20 may be substantially identical to or analogous to some elements, steps, and/or features described with reference to FIGS. 1 to 13. Referring to FIGS. 4, 5, and 15, a gate line 121 and a gate insulating layer 140 are formed on a substrate 110, semiconductor layers 151 and 154 are formed on the gate insulating layer 140, and a source electrode 173 and a drain electrode 175 are formed to partially overlap the semiconductor layer 154. The data line 171 may be connected with the source electrode 173 may cross the gate line 121.

A first interlayer insulating layer 180a is formed on the exposed portion of the semiconductor layer 154 and data conductors 171, 173, and 175 (i.e., the source electrode 173, the drain electrode 175, and the data line 171).

Color filters 230 are formed at positions corresponding to pixel areas on the first interlayer insulating layer 180a. A light blocking member 220 is formed between the color filters 230.

A second interlayer insulating layer 180b (for covering the color filter 230 and the light blocking member 220) is formed on the color filter 230 and the light blocking member 220 and has a contact hole 185 for enabling electrical and physical connection between the pixel electrode 191 and the drain electrode 175.

Thereafter, the pixel electrode 191 is formed on the second interlayer insulating layer 180b and a sacrificial layer 300 is formed on the pixel electrode 191. An open portion OPN is formed in the sacrificial layer 300, as illustrated in FIG. 5. The open portion OPN may be parallel to a data line 171. The open portion OPN may receive a common electrode 270, a lower insulating layer 350, and the partition wall portion PWP. The open portion OPN may be covered by a roof layer 360 and an upper insulating layer 370 in following processes.

Referring to FIGS. 14 and 15, a common electrode 270 material layer, a lower insulating layer 350 material layer, and a roof layer 360 material layer are sequentially formed on the sacrificial layer 300. A portion of the roof layer 360 that overlaps the light blocking member 220 and is disposed between immediately and vertically adjacent pixel areas may be removed through exposing and developing processes. In an embodiment, a sacrificial roof pattern 360s that overlaps (a center of) a horizontal light blocking member 220a may be formed. The horizontal light blocking member 220a may be a horizontal portion of the light blocking member 220, may be parallel to pixel rows, and may be perpendicular to a vertical portion 220b of the light blocking member 220. The sacrificial roof portion 360s be separate from (other portions of) the roof layer 360, which may correspond to pixel areas PX. The upper surface of the lower insulating layer 350 material layer is exposed between portions of the roof layer 360, which may include the sacrificial roof portion 360s and portions that correspond to the pixel areas PX.

The sacrificial roof portion 360s may be parallel to the gate line 121.

Figure 16:
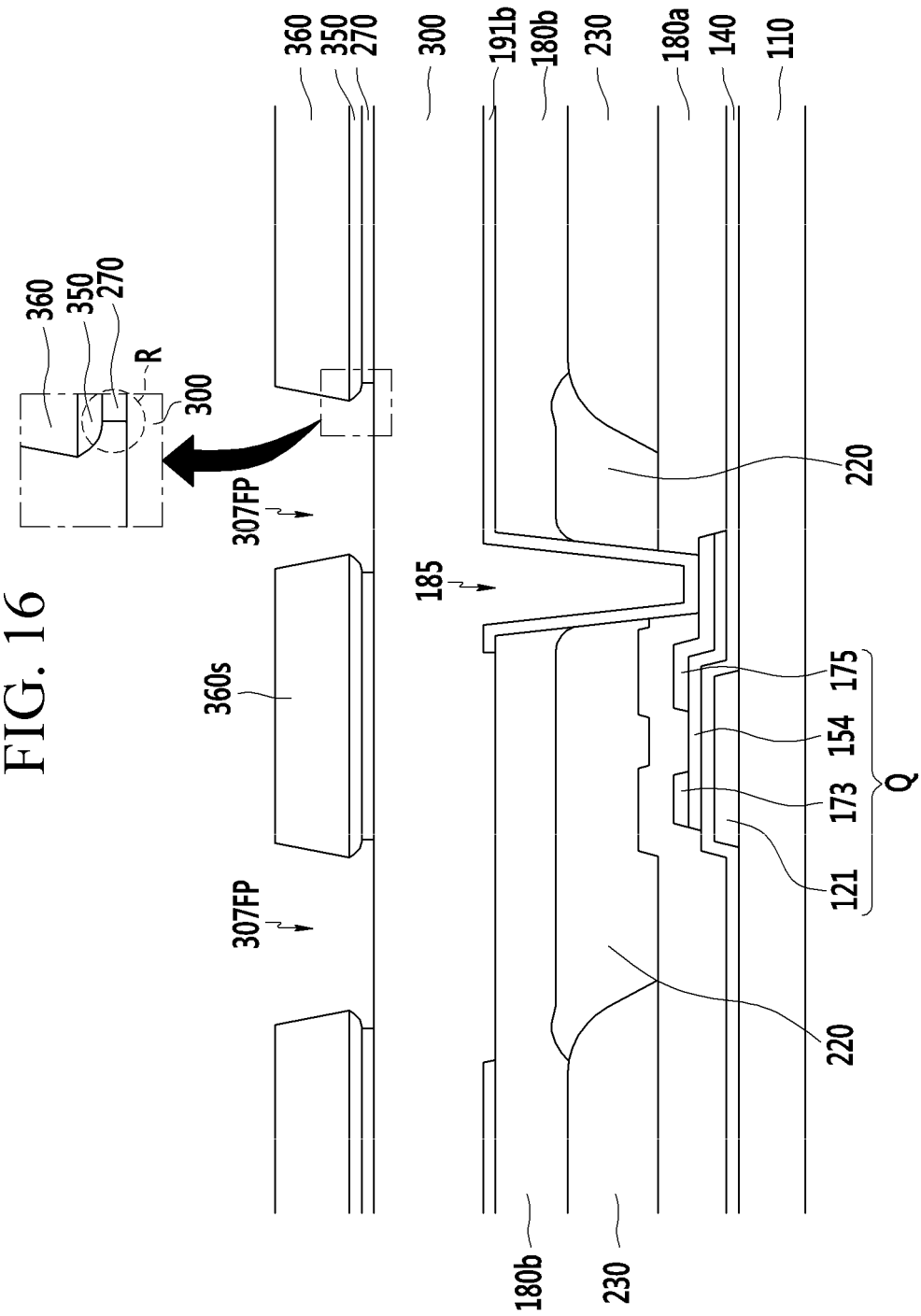

Referring to FIG. 16, the lower insulating layer 350 material layer and the common electrode 270 material layer are patterned with the roof layer 360 functioning as an etching mask. The upper surface of the sacrificial layer 300 is exposed at the etched portions of the lower insulating layer 350 and the common electrode 270. As the sacrificial layer 300 is exposed, the liquid crystal injection hole forming region 307FP is formed.

The exposed portions of the lower insulating layer 350 material and the exposed portions of the common electrode 270, which are not covered by the roof layer 360, may be etched, e.g., through dry etching. The lower insulating layer 350 material layer and the common electrode 270 material layer may be undercut under the roof layer 360 in controlled etching conditions.

The resulted insulating layer 350 and common electrode 270 may form recesses R.

Figure 17:
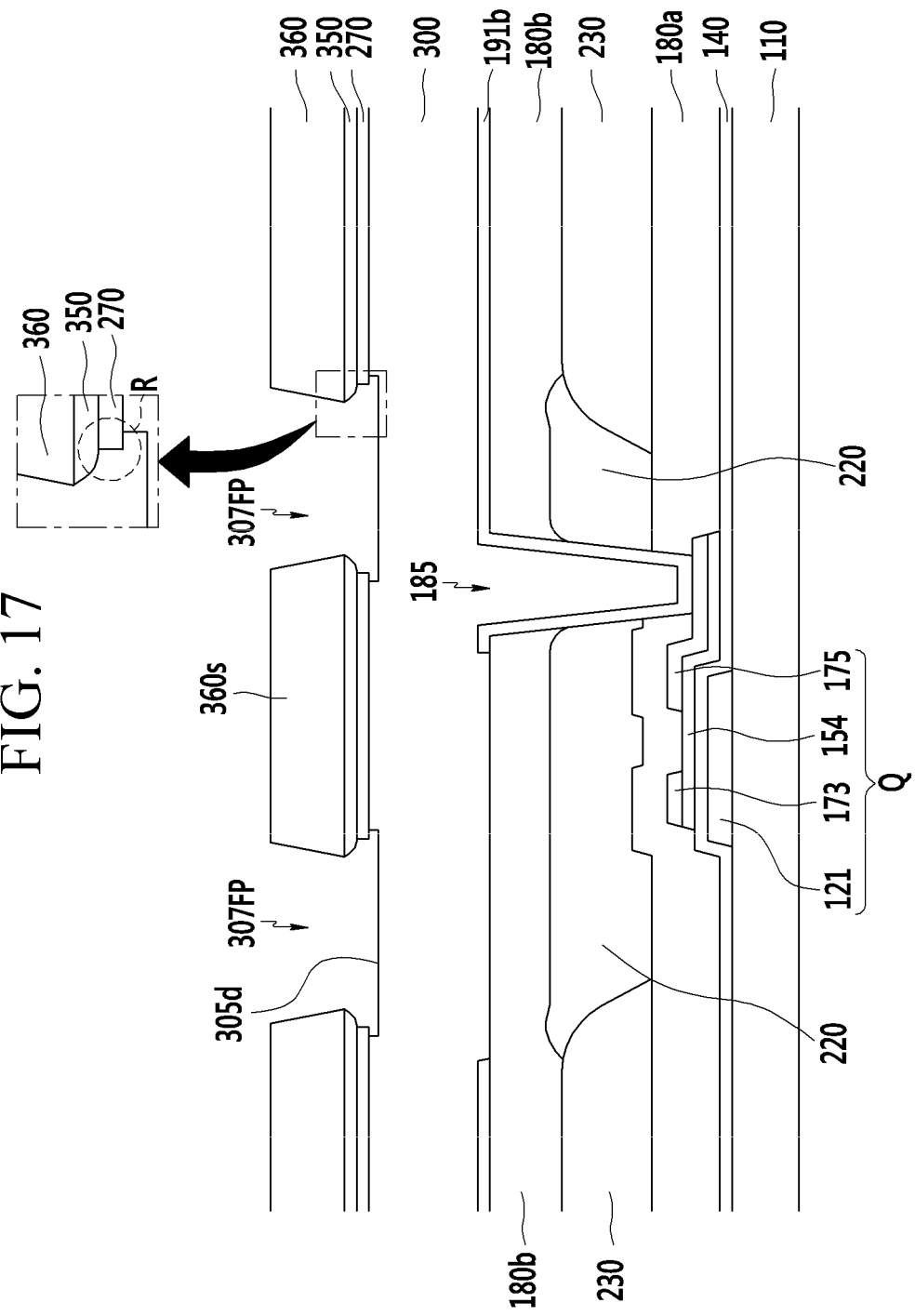

Referring to FIG. 17, in an embodiment, corroded recesses 305d can be formed by ashing portions of the sacrificial layer 300 that are not covered by the common electrode 270, the lower insulating layer 350, and the roof layer 360. The corroded recesses 305d may facilitate disconnection of the upper insulating layer at the recess R. The ashing may soften the sacrificial layer 300. In an embodiment, ashing may not be performed and/or no corroded recesses 305d may be formed on the sacrificial layer 300.

Figure 18:
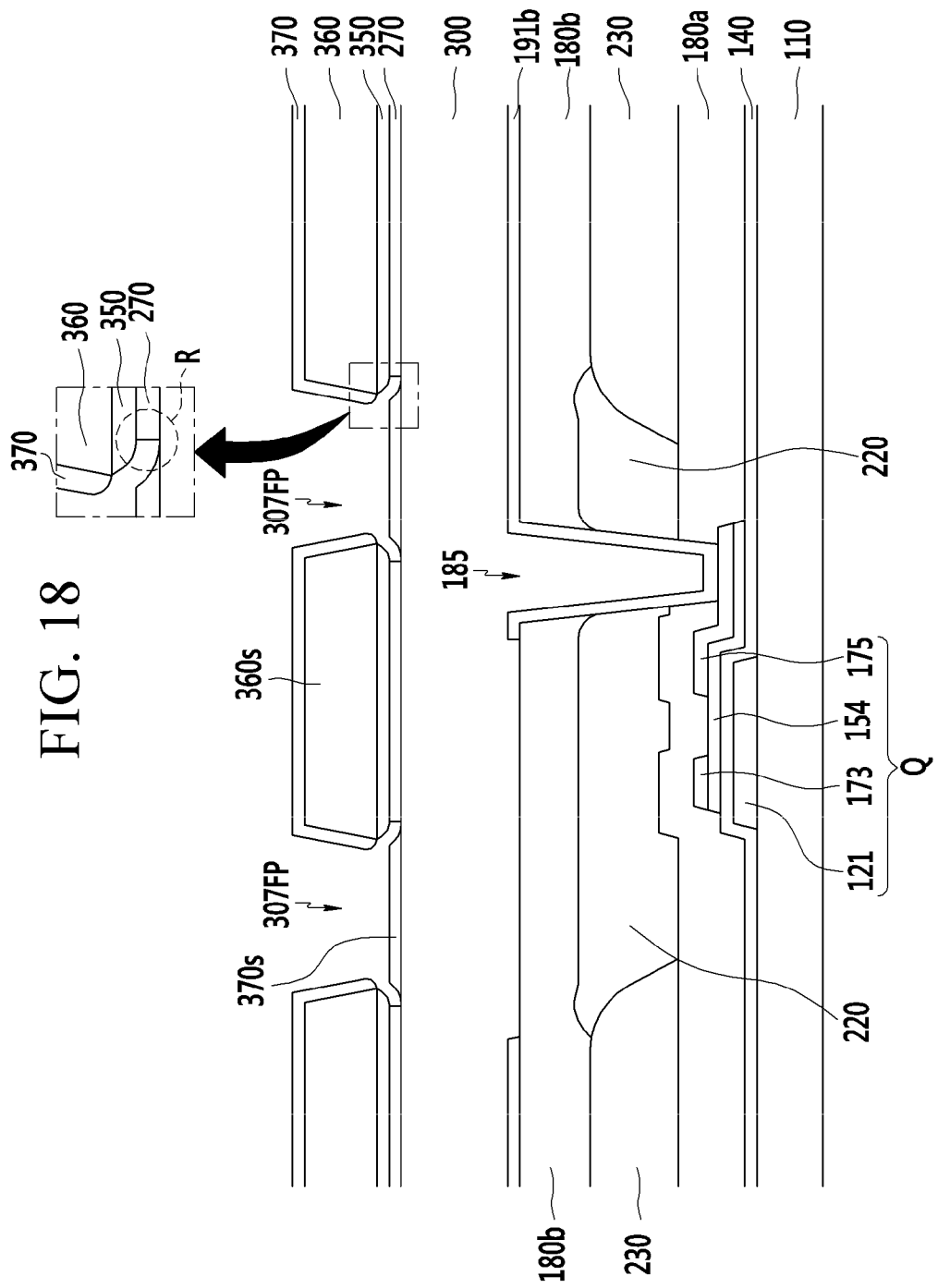

Referring to FIG. 18, an upper insulating layer 370 material layer is formed on the roof layer 360. The upper insulating layer 370 material layer may contact and/or cover not only the upper surface(s) of the roof layer 360, but also lateral surfaces of the roof layer 360. The upper insulating layer 370 material layer may be disconnected at the recesses R formed on the lower insulating layer 350 and the common electrode 270 and may include sacrificial insulating layer portions 370s formed on exposed portions of the upper surface of the sacrificial layer 300 in the liquid crystal injection hole forming region 307FP.

Figure 19:
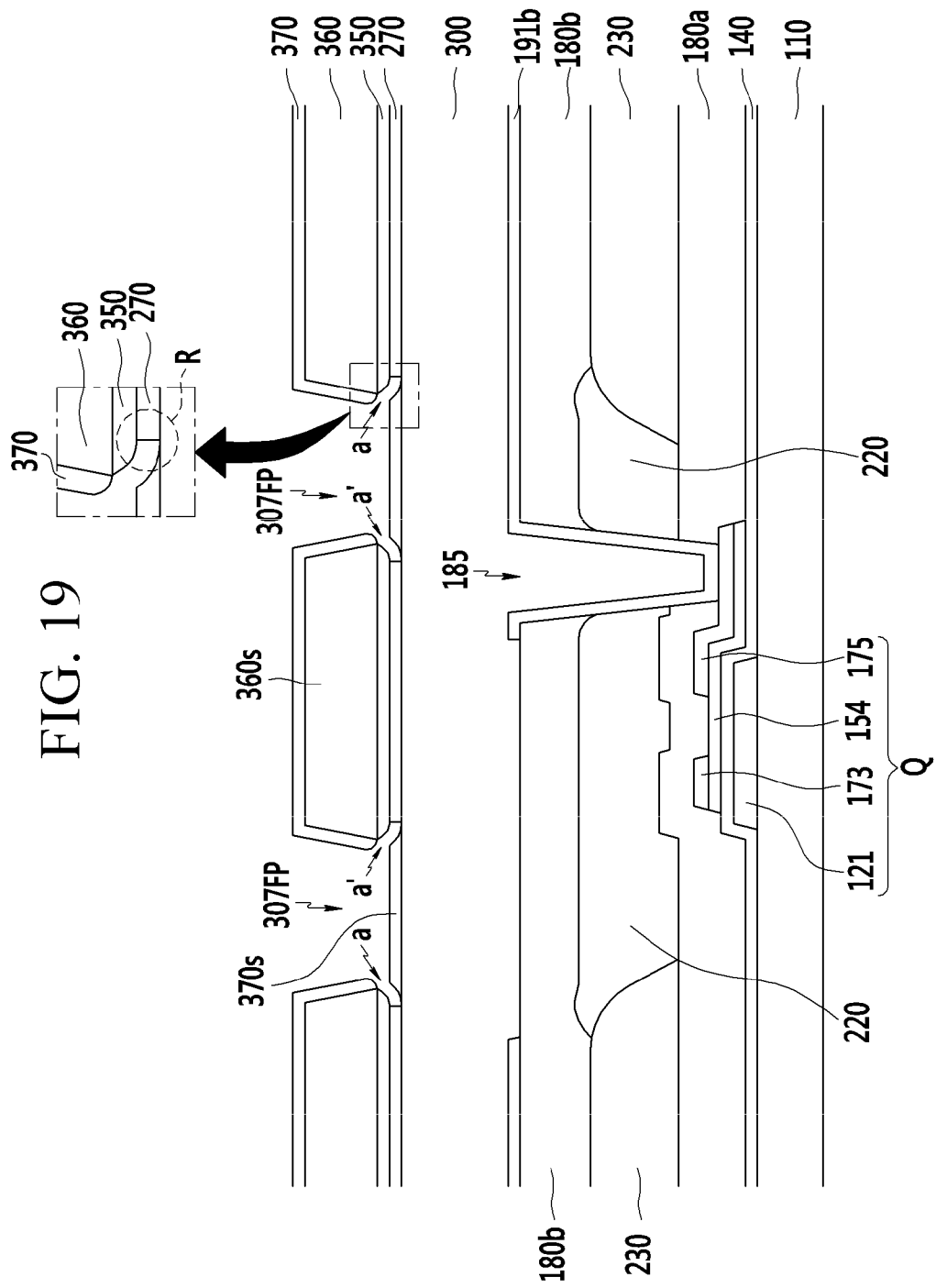

The sacrificial insulating layer pattern 370s may be parallel to the liquid crystal injection hole forming region 307FP. As illustrated in FIG. 19, chemical injection holes a and region 307FPole forming region 307FPe to FIG. 17 performportions 370s and lateral surfaces of the common electrode 270, between the sacrificial insulating layer portions 370s and lateral surfaces of the lower insulating layer 350, between the sacrificial insulating layer portions 370s and edges of the roof layer 360, and/or between the sacrificial insulating layer portions 370s and other portions of the upper insulating layer 370 material layer (or the upper insulating layer 370). Chemical injection holes a and a upper insulation lower edges of the sacrificial roof portions 360s and are formed at lower edges of portions of the roof layer 360 that correspond to pixel areas. Advantageously, removal of the sacrificial layer 300 may be expedited and/or controlled by injecting a suitable chemical through the chemical injection holes a and aa.

Figure 20:
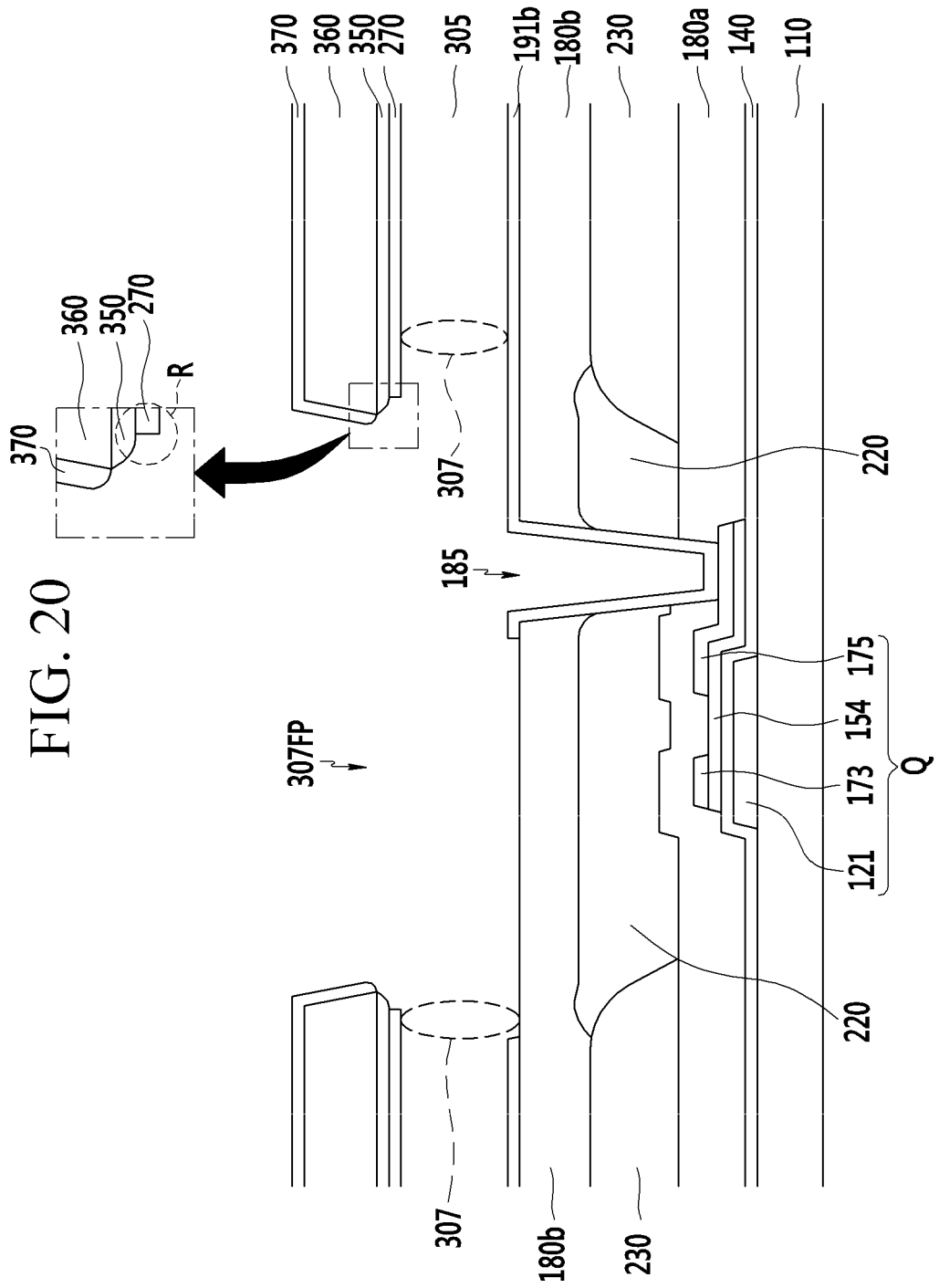

Referring to FIG. 20, the sacrificial layer 300 is removed by injecting a chemical for removing the sacrificial layer 300 through the chemical injection holes a and a' illustrated in FIG. 19. Accordingly, empty microcavities 305 with liquid crystal injection holes 307 are formed.

Thereafter, the alignment layers 11 and 21 are formed on the pixel electrode 191 and the common electrode 270 by injecting an alignment material through the liquid crystal injection hole 307 and subsequently baking the alignment material. The alignment material may contain a solid and a solvent.

Subsequently, the liquid crystal display illustrated in FIG. 13 is formed by injecting a liquid crystal material containing the liquid crystal molecules 310 into the microcavities 305 through the liquid crystal injection hole 307, for example, using an inkjet method.

Figure 21:
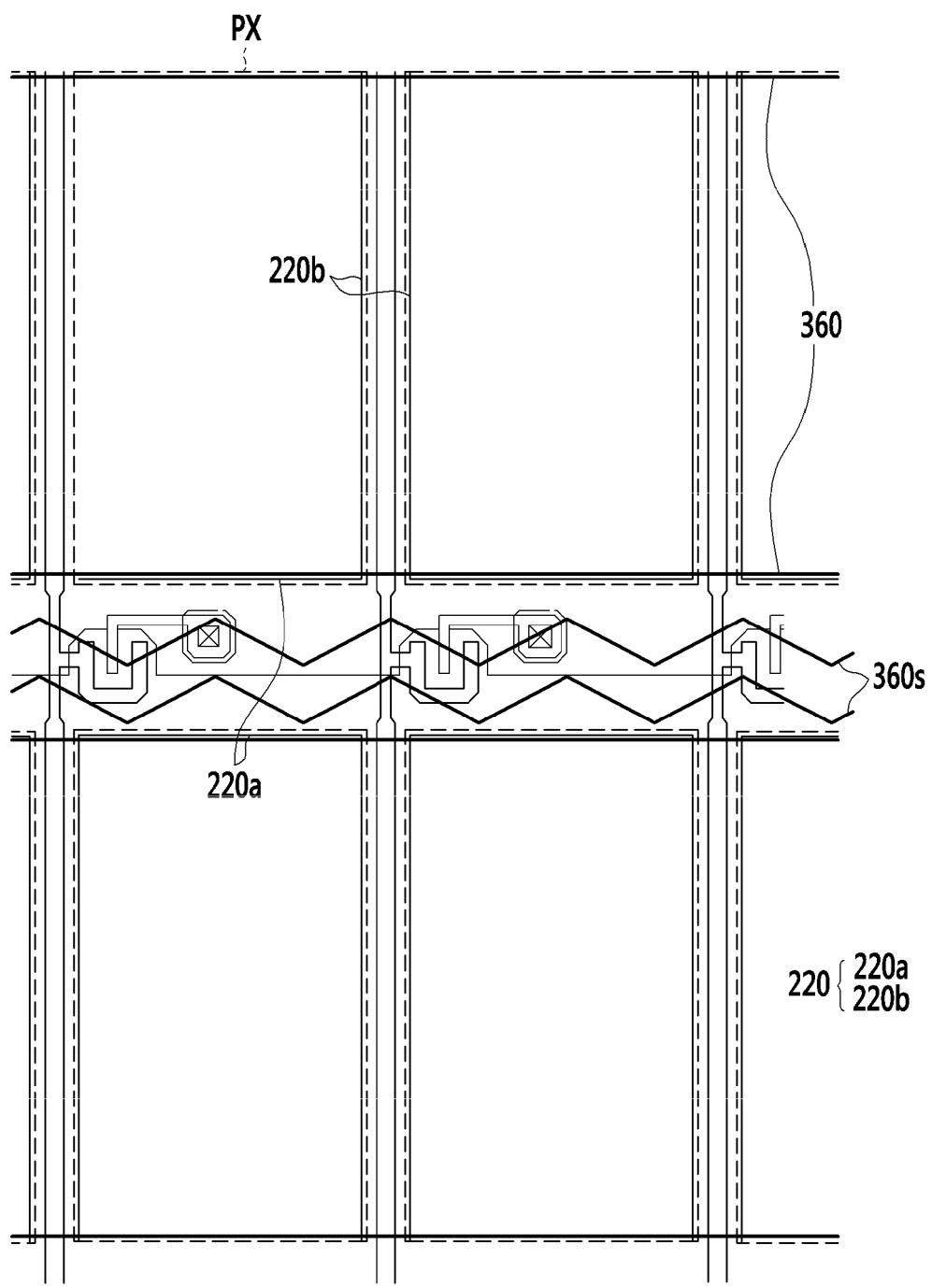
FIGS. 21 and 22 are top plan views illustrating structures for manufacturing liquid crystal displays according to embodiments of the present invention.
Figure 22:
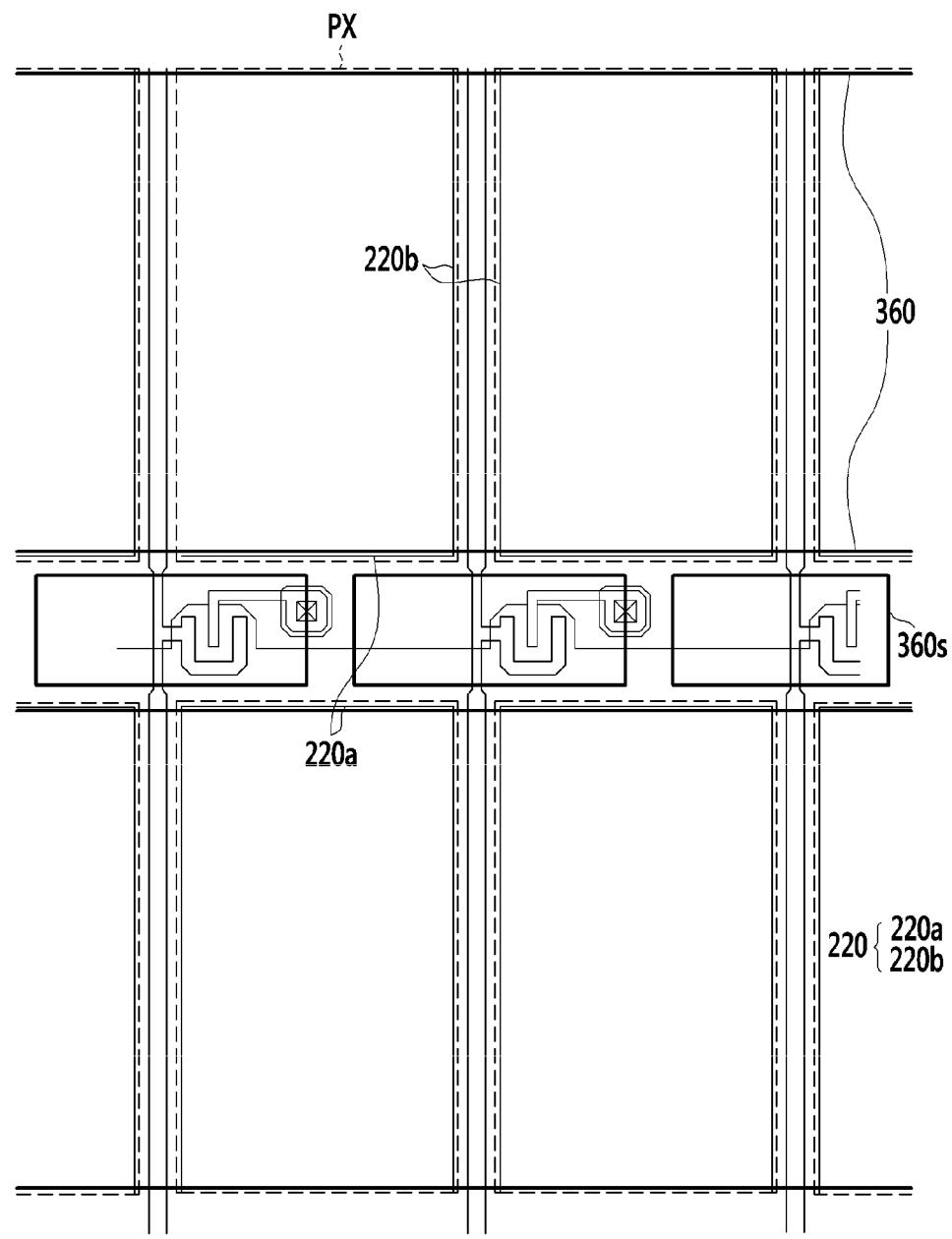

FIGS. 21 and 22 are top plan views illustrating structures for manufacturing liquid crystal displays according to embodiments of the present invention. Some elements and features of the structures for manufacturing liquid crystal displays illustrated in FIGS. 21 and 22 may be substantially identical to or analogous to some elements and features of the structures illustrated in FIG. 14.

In the structure illustrated in FIG. 14, the sacrificial roof portions 360s may be substantially straight, substantially continuous, and substantially parallel to the gate line 121. In the structure illustrated in FIG. 21, each sacrificial roof portion 360s may be formed in a zigzag shape or a saw tooth shape. In the structure illustrated in FIG. 22, sacrificial roof portions 360s may be formed in separate rectangular islands. The zigzag configuration, the saw tooth configuration, and/or the separate island configuration may maximize or optimize the number or coverage of chemical injection holes. Advantageously, efficiency of removal of the sacrificial layer 300 may be maximized. The structures and/or shapes of the sacrificial roof portions 360s may be configured based on the chemicals to be used and/or based on the intended amounts and/or coverage of chemical injection holes according to particular embodiments.

While the present invention has been described in connection with what is presently considered to be practical embodiments, it is to be understood that the invention is not limited to the disclosed embodiments. The invention is intended to cover various modifications and equivalent arrangements within the spirit and scope of the appended claims.

What is claimed is:

1. A method for manufacturing a display device, the method comprising:
forming a first pixel electrode and a second pixel electrode that neighbor each other with no intervening pixel electrode and overlap a substrate in a first direction, the first direction being perpendicular to a surface of the substrate;
forming a common electrode material layer that overlaps the first pixel electrode and the second pixel electrode;
forming a roof layer material layer that overlaps the common electrode material layer;
removing a portion of the roof layer material layer that is positioned between the first pixel electrode and the second electrode to form a first roof layer portion and a second roof layer portion, the first roof layer portion overlapping the first pixel electrode, the second roof layer portion overlapping the second pixel electrode, a lateral surface of the first roof layer portion being disposed in a first plane; and
removing a portion of the common electrode material layer to form a first common electrode portion and a second common electrode portion, the first common electrode portion being disposed between the first roof layer portion and the first pixel electrode, the second common electrode portion being disposed between the second roof layer portion and the second pixel electrode, a lateral surface of the first common electrode portion being disposed in the first plane or being spaced from the lateral surface of the first roof layer portion in a second direction parallel to the surface of the substrate.

2. A method for manufacturing a display device, the method comprising:

forming a first pixel electrode and a second pixel electrode that overlap a substrate in a first direction, the first direction being perpendicular to a surface of the substrate;

forming a common electrode material layer that overlaps the first pixel electrode and the second pixel electrode;

forming a roof layer material layer that overlaps the common electrode material layer;

removing a portion of the roof layer material layer to form a first roof layer portion and a second roof layer portion, the first roof layer portion overlapping the first pixel electrode, the second roof layer portion overlapping the second pixel electrode, a lateral surface of the first roof layer portion being disposed in a first plane;

removing a portion of the common electrode material layer to form a first common electrode portion and a second common electrode portion, the first common electrode portion being disposed between the first roof layer portion and the first pixel electrode, the second common electrode portion being disposed between the second roof layer portion and the second pixel electrode, a lateral surface of the first common electrode portion being disposed in the first plane or being spaced from the lateral surface of the first roof layer portion in a second direction parallel to the surface of the substrate;

disposing a first mask portion that overlaps the first roof layer portion, wherein an edge of the first mask portion is aligned with an edge of the first roof layer portion in the first direction;

disposing a second mask portion that overlaps the second roof layer portion, wherein an edge of the second mask portion is aligned with an edge of the second roof layer portion in the first direction; and using the first mask portion and the second mask portion to partially protect the common electrode material layer when removing the portion of the common electrode material layer.

3. The method of claim 2, further comprising:

forming an insulating material layer on the first roof layer portion and the second roof layer portion such that the insulating material layer directly contacts the lateral surface of the first roof layer portion; and using the first mask portion and the second mask portion to partially protect the insulating material layer when removing a portion of the insulating material layer disposed between the first roof layer portion and the second roof layer portion to form a first insulating layer part and a second insulating layer part.

4. The method of claim 3, wherein a lateral surface of the first insulating layer part is disposed in the first plane.

5. The method of claim 1, further comprising:

forming an insulating material layer that directly contacts the common electrode material layer;

removing a portion of the insulating material layer to form a first insulating layer portion and a second insulating layer portion, the first insulating layer portion being disposed between the first roof layer portion and the first common electrode portion, a lateral surface of the first insulating layer portion being disposed in the first plane or being disposed between the lateral surface of the first roof layer portion and the substrate in the first direction.

6. A method for manufacturing a display device, the method comprising:

forming a first pixel electrode and a second pixel electrode that overlap a substrate in a first direction, the first direction being perpendicular to a surface of the substrate;

forming a common electrode material layer that overlaps the first pixel electrode and the second pixel electrode;

forming a roof layer material layer that overlaps the common electrode material layer;

removing a portion of the roof layer material layer to form a first roof layer portion and a second roof layer portion, the first roof layer portion overlapping the first pixel electrode, the second roof layer portion overlapping the second pixel electrode, a lateral surface of the first roof layer portion being disposed in a first plane;

removing a portion of the common electrode material layer to form a first common electrode portion and a second common electrode portion, the first common electrode portion being disposed between the first roof layer portion and the first pixel electrode, the second common electrode portion being disposed between the second roof layer portion and the second pixel electrode, a lateral surface of the first common electrode portion being disposed in the first plane or being spaced from the lateral surface of the first roof layer portion in a second direction parallel to the surface of the substrate;

forming a first sacrificial roof layer portion between the first roof layer portion and the second roof layer portion; and using the first roof layer portion, the second roof layer portion, and the first sacrificial roof layer portion to partially protect the common electrode material layer when removing the portion of the common electrode material layer, such that a sacrificial common electrode portion is formed between the first common electrode portion and the second common electrode portion.

7. The method of claim 1, further comprising:

forming a first insulating material layer that directly contacts the common electrode material layer;

using the first roof layer portion, the second roof layer portion, and the first sacrificial roof layer portion to partially protect the first insulating material layer when removing a portion of the first insulating material layer to form a first insulating layer portion, a second insulating layer portion, and a sacrificial insulating layer portion disposed between the first insulating layer portion and the second insulating layer portion, the first insulating layer portion being disposed between the first roof layer portion and the first common electrode portion, a lateral surface of the first insulating layer portion being disposed between the lateral surface of the first roof layer portion and the substrate in the first direction.

8. The method of claim 7, further comprising:

before the forming the common electrode material layer, forming a sacrificial layer that overlaps the substrate;

disposing a second insulating material layer on the first roof layer portion, a portion of the sacrificial layer, and the first sacrificial roof layer portion such that a first insulating layer part is formed on the first roof layer portion, that a first sacrificial insulating layer part is formed between the first common electrode portion and the sacrificial common electrode portion, that a second sacrificial insulating layer part is formed on the first sacrificial roof layer portion, that a first hole is formed between the first insulating layer portion and the first sacrificial insulating layer part, and that a second hole is formed between the sacrificial insulating layer portion and the first sacrificial insulating layer part;

providing one or more chemicals through the first hole and the second hole for removing the sacrificial layer to form a cavity; and providing a liquid crystal material in the cavity.

9. The method of claim 8, wherein the first insulating layer part meets the first insulating layer portion at a corner of the first roof layer portion.

10. The method of claim 8, wherein the first insulating layer part covers the lateral portion of the first roof layer portion.

11. The method of claim 6, further comprising:
before the forming the common electrode material layer, forming a sacrificial layer that overlaps the substrate;
disposing an insulating material layer on the first roof layer portion, a portion of the sacrificial layer, and the first sacrificial roof layer portion such that a first insulating layer part is formed on the first roof layer portion, that a first sacrificial insulating layer part is formed between the first common electrode portion and the sacrificial common electrode portion, that a second sacrificial insulating layer part is formed on the first sacrificial roof layer portion, that a first hole is formed between the first common electrode portion and the first sacrificial insulating layer part, and that a second hole is formed between the sacrificial common electrode portion and the first sacrificial insulating layer part;
providing one or more chemicals through the first hole and the second hole for removing the sacrificial layer to form a cavity; and
providing a liquid crystal material in the cavity.

12. The method of claim 11, further comprising: before the disposing the insulating material layer, performing ashing on the sacrificial layer.

13. The method of claim 11, wherein at least one of the first sacrificial insulating layer part, the second sacrificial insulating layer part, the first sacrificial roof portion, and the sacrificial common electrode portion is removed when the sacrificial layer is removed.

14. The method of claim 11, further comprising:
forming a gate line; and
forming a transistor that overlaps the substrate and includes a gate electrode, wherein the gate electrode is electrically connected to the gate line, and wherein the first hole extends parallel to the gate line.

15. The method of claim 11, further comprising: forming a second sacrificial roof layer portion between the first roof layer portion and the second roof layer portion, wherein a gap separates the second sacrificial roof layer portion from the first sacrificial roof layer portion and connects the second hole to the first hole.

16. The method of claim 6, further comprising:
before the forming the common electrode material layer, forming a sacrificial layer that overlaps the substrate;
using the first roof layer portion, the second roof layer portion, and the first sacrificial roof layer portion to partially protect the sacrificial layer when removing a portion of the sacrificial layer;
removing the sacrificial layer to form a cavity; and
providing a liquid crystal material in the cavity.

17. The method of claim 6, wherein the first sacrificial roof layer portion has a saw tooth shape in a plan view of the first sacrificial roof layer portion.

18. The method of claim 6, further comprising: forming a second sacrificial roof layer portion between the first roof layer portion and the second roof layer portion, the second sacrificial roof layer portion being spaced from the first sacrificial roof layer portion and being part of the roof layer material layer.

19. The method of claim 6, further comprising: forming a transistor that overlaps the substrate, wherein the first sacrificial roof layer portion overlaps the transistor.

20. The method of claim 19, further comprising: forming a gate line that is electrically connected to a gate electrode of the transistor, wherein the first sacrificial roof layer portion extends parallel to the gate line.

* * * * *